(12) United States Patent  
Slesazeck et al.

(10) Patent No.: US 11,205,467 B2  
(45) Date of Patent: Dec. 21, 2021

(54) FERROELECTRIC MEMORY AND LOGIC CELL AND OPERATION METHOD

(71) Applicant: NaMLab gGmbH, Dresden (DE)

(72) Inventors: Stefan Slesazeck, Arnsdorf (DE); Milan Pesic, Berlin (DE)

(73) Assignee: NaMLab gGmbH, Dresden (DE)

( * ) Notice: Subject to any disclaimer, the term of this patent is extended or adjusted under 35 U.S.C. 154(b) by 132 days.

(21) Appl. No.: 16/782,441

(22) Filed: Feb. 5, 2020

(65) Prior Publication Data

US 2020/0357453 A1 Nov. 12, 2020

Related U.S. Application Data

(60) Provisional application No. 62/845,464, filed on May 9, 2019.

(51) Int. Cl.
*G11C 11/22* (2006.01)
*G06N 3/063* (2006.01)

(52) U.S. Cl.
CPC ........ *G11C 11/221* (2013.01); *G11C 11/2255* (2013.01); *G11C 11/2257* (2013.01); *G11C 11/2259* (2013.01); *G11C 11/2273* (2013.01); *G06N 3/0635* (2013.01)

(58) Field of Classification Search
CPC .............. G11C 11/221; G11C 11/2255; G11C 11/2257; G11C 11/2259; G11C 11/2273

USPC ........................................................ 365/145
See application file for complete search history.

(56) References Cited

U.S. PATENT DOCUMENTS

| | | | |
|---|---|---|---|
| 5,999,439 A | 12/1999 | Seyyedy | |
| 6,646,906 B2 | 11/2003 | Salling | |
| 6,999,336 B2 | 2/2006 | Sakuma | |
| 7,848,131 B2 | 12/2010 | Kim | |
| 10,068,630 B2 | 9/2018 | Park et al. | |
| 10,074,422 B1 | 9/2018 | Tandingan et al. | |
| 10,211,312 B2 | 2/2019 | Van Houdt et al. | |
| 10,304,558 B2 | 5/2019 | Mariani et al. | |
| 2009/0189152 A1 | 7/2009 | Cho et al. | |
| 2010/0027327 A1* | 2/2010 | Chung | G11C 13/0069 365/163 |
| 2011/0170330 A1 | 7/2011 | Oezyilmaz et al. | |
| 2016/0064391 A1* | 3/2016 | Li | H01L 27/11507 365/145 |
| 2019/0074295 A1 | 3/2019 | Schroder | |
| 2019/0371802 A1* | 12/2019 | Morris | H01L 28/55 |

* cited by examiner

*Primary Examiner* — Xiaochun L Chen

(74) *Attorney, Agent, or Firm* — Dicke, Billig & Czaja, PLLC

(57) ABSTRACT

One example provides a memory cell including a node, and a layer stack including a first electrode, a second electrode connected to the node, and a polarizable material layer disposed between the first and second electrodes and having at least two polarization states. A first transistor includes a source, a drain, and a gate terminal, with the gate terminal connected to the node. A selector element includes at least a first terminal and a second terminal, with the second terminal connected to the node.

23 Claims, 25 Drawing Sheets

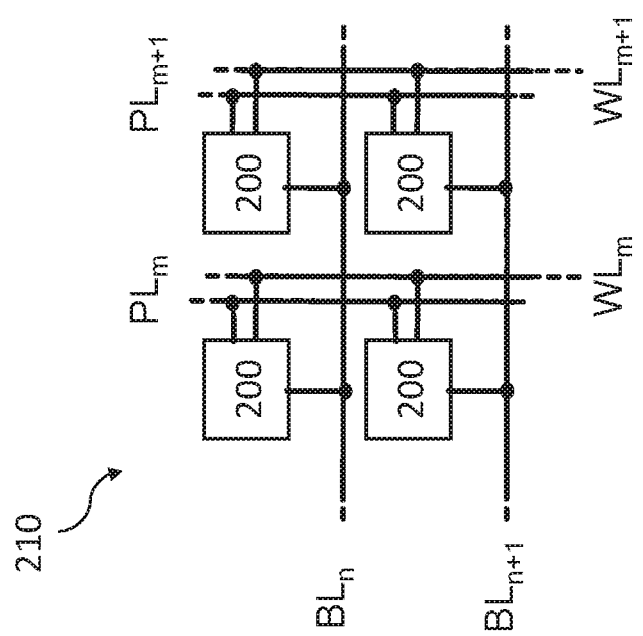

FERROELECTRIC MEMORY AND LOGIC CELL AND OPERATION METHOD

CROSS REFERENCE TO RELATED APPLICATIONS

This Non-Provisional Application claims benefit of Provisional Application No. 62/845,464, entitled "FERROELECTRIC MEMORY AND LOGIC CELL AND OPERATION METHOD", filed May 9, 2019 which is incorporated herein by reference.

BACKGROUND

The present disclosure is related to ferroelectric memory cells, ferroelectric logic cells, ferroelectric logic in memory cells, and ferroelectric weighting cells for neuromorphic computation.

Many electronic devices and systems have the capability to store and retrieve information in a memory structure. In the von Neumann architecture, which is typically used in modern electronic devices, information is processed in a central processing unit (CPU) while information is stored in a separate memory. As a result, information must be transmitted between the CPU and the memory for processing and storing, thereby creating what is referred to as the von-Neumann bottleneck. "Logic in Memory" (LiM) and neuromorphic circuits address the von-Neumann architecture bottleneck by reducing transit times of information by using non-volatile memory (NVM) elements for information processing and fine-grained implementation of logic circuits directly with memory elements in the processing unit. A number of different non-volatile memory devices have been demonstrated in such concepts, including Flash, resistive RAMs (ReRAM), magnetoresistive RAM (MRAM), and phase change memory (PCM).

With regard to ferroelectric (FE) structures, non-volatile memory (NVM) elements can be realized as capacitor type (e.g., a ferroelectric random access memory (FeRAM), ferroelectric tunnel junction type (FTJ)), and transistor type (e.g. a ferroelectric field effect transistor (FeFET)) solutions, where information is stored as a certain polarization state of a ferroelectric material layer within the structure. The ferroelectric material used may be hafnium dioxide ($HfO_2$), zirconium dioxide, or a solid solution of both transition metal oxides. In the case of pure hafnium oxide, a remnant polarization can be improved by incorporating a dopant species into the $HfO_2$ layer during the deposition.

The ferroelectric material is intended to partially or fully replace a gate oxide of a transistor or a dielectric of a capacitor. Switching is caused by applying an electrical field via a voltage between the transistor gate and transistor channel. Specifically, for n-channel transistors, ferroelectric switching after applying a sufficiently high positive voltage pulse causes a shift of the threshold voltage to lower or more negative values, whereas applying a sufficiently high negative voltage pulse causes a shift of the threshold voltage to higher or more positive values. For p-channel transistors, ferroelectric switching after applying a sufficiently high positive voltage pulse causes a shift of the threshold voltage to higher absolute or more positive values, whereas applying a sufficiently high negative voltage pulse causes a shift of the threshold voltage to lower absolute or more negative values.

Generally hafnium/zirconium oxide-based memory devices offer fast sensing and programming access times and lower power consumption during programming operation due to the specific physical storage mechanism. Further, these memory devices are easy to integrate into High-k metal gate CMOS technology since the materials employed for FeFET, FeRAM and FTJ memory devices are already used as gate oxide or DRAM dielectric materials. These advantages, and others, contribute to the increasing popularity of hafnium/zirconium oxide-based memory devices for embedded storage as well as for stand-alone applications to be adopted in devices such as memory cards, USB flash drives, mobile phones, digital cameras, mass storage devices, MP3 players, smart watches and the like.

FIG. 1 is a schematic diagram of a FeFET memory cell, according to one example. In the FeFET memory cell, a polarization state of the ferroelectric layer is determined by sensing a threshold voltage of the transistor. In one example, with further reference to FIG. 2a, such sensing is performed by either charging or discharging a bit line which is connected to the Source or Drain terminal of the FeFET and sensing the voltage change at the bit line after a certain time by sensing the current flow through the FeFET by adoption of a suitable sense amplifier (SA). The circuit element T1 represents the FeFET device. In the illustrated example of FIG. 1, the gate (g) of transistor T1 is connected to a word line WL, whereas source terminal (s) and drain terminal (d) are connected to bit line BL and source line SL, respectively. The body contact (b) of the transistor is connected to a p-well PW terminal which is shared by many memory transistors in a memory array (not illustrated). A sensing operation typically determines the threshold voltage or on-current of the FeFET under specific read conditions. The polarization state of the FeFET is maintained during read operation. Therefore it is a non-destructive read operation.

In the example FeRAM memory cell of FIG. 2a, the polarization state of the ferroelectric layer is determined by sensing a displacement current of the ferroelectric capacitor upon application of an electrical switching pulse. According to such example, such a sensing operation is a destructive read operation as the polarization state has to be rewritten into the cell after read operation.

With reference to FIG. 2a, for sensing a displacement current resulting from a polarization reversal during a switching operation, the polarization charge originating from ferroelectric capacitor C1 is transferred via a selector device T2 (e.g. a CMOS transistor) to a bit line (BL). A resulting voltage change at the bit line is determined by a voltage sense amplifier SA, which is connected to the respective bit line.

In addition to the 1T1C FeFET memory cell described above, in other examples, additional transistors may be added to the 1T1C ferroelectric memory cell to form a 2T1C ferroelectric memory cell.

One example, which is configured to prevent read and write disturb effects, is described by U.S. Pat. No. 7,848,131, where an additional pre-charge transistor, TP, is connected in parallel to ferroelectric capacitor C1 (see FIG. 2b.). The gate of charge transistor, TP, is connected to a pre-charge control line PCL. The pre-charge transistor TP is used to pre-charge an electrical node formed between select transistor T2 and ferroelectric capacitor C1 to a certain potential in case T2 is switched off in order to prevent read or write disturb effects affecting the memory state of C1 during array read/write operations.

A second example of a 2T1C ferroelectric memory cell to improve signal-to-noise ratio is described in US10074422. A select transistor, bit line, and word line double up to connect C1 to complementary bit lines, one for the data read signal BL(data) and one for the reference read signal BL(reference), as schematically depicted in FIG. 2c. In this configuration, a differential readout operation improves a signal-to-noise ratio to improve reliability of data readout by the differential SA.

When arranging such memory cells in an array of memory cells, several memory cells are typically connected to a shared BL and, thus, share one sense amplifier SA. In order to yield a sufficient voltage signal at the bit line for reliable memory state detection by the SA, the amount of polarization charge stored in each memory cell capacitor has to sufficiently large to induce a sufficient read signal at the bit line. Therefore, for highly scaled CMOS technology nodes (i.e., with a half pitch smaller than 130 nm or with a half pitch smaller than 90 nm and typical numbers of 64, 128 or 256 memory cells connected to one bit line), a 3D integration of the ferroelectric capacitor is typically necessary to realize the required storage capacitor area without consuming too much silicon area. In one example, when applying an electrical potential across the two terminals of a ferroelectric capacitor, C1, a leakage current flowing through the ferroelectric capacitor C1 may depend on the polarization state of the ferroelectric capacitor. For example, when the ferroelectric is switched to the negative polarization state, thus representing an erased logic state "0", a relatively lower current will flow through the capacitor when applying a non-zero voltage to its two terminals, compared to the case when the ferroelectric is switched to the positive polarization state, thus representing a programmed logic state "1", or vice versa. Such difference in leakage current is present particularly for a case when a voltage lower than the coercive voltage of the ferroelectric capacitor is applied to its two terminals. A ferroelectric capacitor that exhibits such electrical behavior is also often referred to as ferroelectric tunnel junction (FTJ).

FIG. 13a a schematic band diagram generally illustrating an on state of a tunnel junction consisting of two electrodes (1305, 1330) and a tunnel barrier (1340) being a two layer stack including of a thin dielectric material (1320) and a ferroelectric material (1310). Fermi levels $E_{FM1}$ and $E_{FM2}$ of the two electrodes (1305, 1330), a valence band $E_V$, and a conduction band $E_B$ of the tunnel barrier (1340) are plotted. Due to the voltage applied between the two electrodes (1305, 1330) and the polarization of the ferroelectric material layer being in a first direction, tunneling is possible from conduction band of electrode (1330) to the conduction band of electrode (1305). The off state of such a device is plotted in FIG. 13b. The Fermi levels $E_{FM1}$ and $E_{FM2}$ of the two electrodes (1305, 1330), the valence band $E_V$ and the conduction band $E_B$ of the tunnel barrier (1340) are plotted. Due to the same voltage applied between the two electrodes, but with the polarization of the ferroelectric material layer being in a second direction, no tunneling is possible from the valance band of electrode (1330) to the conduction band of electrode (1305).

Typical FTJ stacks feature either a very thin ferroelectric material layer which allows a sufficient tunneling current. In other configurations of the FTJ, a composite stack is adopted where an additional thin dielectric layer acts as the tunneling barrier providing larger read currents while the ferroelectric material layer is responsible for storing the polarization state.

Generally, the typical read current density of a FTJ is very low (e.g. typically <1 µA/cm$^2$). Therefore, a sufficient area of the FTJ, low parasitic leakage currents at the BL and a very sensitive SA are required to enable reliable reading of the FTJs memory state. A low read current, which might be in the range <1 nA for a scalded device with a FTJ area in the range of 100 nm×100 nm, is one of the most critical issues presently hindering the application of FTJs in larger memory arrays.

The benefit of the FeFET memory device compared to the FeRAM and FTJ cell is its easy integration into state-of-the-art CMOS processes. A 3D capacitor structure is not necessary to provide the required current or charge for the read operation by the SA. Due to the internal gain of the FeFET device, sufficient charge being independent of the gate area can be provided to the BL for sensing of the stored polarization state by the SA.

FeFET memory devices have lower cycling endurance as compared to FeRAM capacitor devices due to a degradation of an interfacial silicon dioxide layer sandwiched between the silicon channel and the ferroelectric high-k hafnium/zirconium oxide layer. Such silicon oxide interface is necessary to prevent chemical reactions between the high-k layer and the silicon channel during manufacturing and to preserve a sufficient electron mobility in the channel. The relatively high coercive field for polarization reversal of the ferroelectric layer in the range of 1 MV/cm and the relation between the relative permittivity of the silicon oxide interface (about 3.8 to 7 for nitride interfaces) and the ferroelectric hafnium oxide (about 30) yields an electric field peak in the range of 10 MV/cm in the interfacial silicon oxide layer during a polarization switching operation. Such value is close to a break down field of the interfacial oxide layer. Therefore, repeated switching of the FeFET device results in a wear out of the interfacial silicon oxide layer, which leads to an increase of charge trapping effects and a reduction of the measurable memory window.

To combine the benefits of the high cycling endurance of a ferroelectric metal-insulator-metal capacitor having no interfacial oxide and which, thus, exhibits an improved reliability with the smaller cell size as well as lower manufacturing complexity of a FeFET device, a metal-ferroelectric-metal capacitor C1 may be directly connected in between the gate electrode of a read transistor T3 and the word line terminal WL as is shown schematically in FIG. 3a. In that way a combined FeFET memory cell may be realized which is operated in a similar way to a conventional FeFET memory cell. In this case, the electrical node n1 is a floating node that has no direct connection to ground.

A capacitive voltage divider ratio between the gate capacitor of the transistor T3 and the ferroelectric capacitor C1 will determine a potential at node n1 upon application of a voltage between WL terminal and SL, PW and BL terminals. For example, for a relatively larger capacitance of C1 compared to the gate capacitance of T3, a smaller portion of the voltage will drop over the capacitor C1, whereas for a relatively smaller capacitance of C1 compared to the gate capacitance of T3 a larger portion of the voltage will drop over the capacitor C1. The capacitive voltage divider ratio between C1 and the gate electrode of transistor T3 will determine the effective coercive voltage of the combined FeFET memory cell, where the coercive voltage is defined as the voltage that has to be applied to the WL terminal in order to induce polarization reversal of ferroelectric capacitor C1.

For performing a write operation, a positive voltage, that is larger than the effective coercive voltage of the combined FeFET memory cell, is applied to the WL terminal of the combined FeFET memory cell (FIG. 3b) while all other terminals stay grounded. In that way, the ferroelectric capacitor C1 will be switched to the upwards polarized state. The resulting polarization current will result in an increase of the electrical potential of node n1.

In contrast, for performing an erase operation either a negative voltage, that is smaller than the negative effective coercive voltage of the combined FeFET memory cell, is applied to the WL terminal while all other terminals stay grounded (FIG. 3b), or a positive voltage, where the absolute value of the voltage is larger than the effective negative coercive voltage of the combined FeFET memory cell, is applied simultaneously to the SL, BL and PW terminal while the WL terminal stays grounded. In that way, the ferroelectric capacitor C1 will be switched to the downwards polarized state. The resulting polarization current will result in a decrease of the electrical potential of node n1.

For performing a read operation, a positive voltage, that is smaller than the effective coercive voltage of the combined FeFET memory cell, is applied to the WL terminal of the combined FeFET memory cell. Additionally, a voltage is applied at the BL terminal. Depending on the polarization charge of capacitor C1 and the corresponding voltage on node n1, the gate terminal of T3 will experience a different effective applied gate voltage and a corresponding current will flow between SL and BL terminal. In that way the polarization state of the ferroelectric capacitor C1 can be determined in a non-destructive way.

However, due to leakage currents that might flow through the gate dielectric of the transistor T3 and through the ferroelectric capacitor C1, the voltage at node n1 might change over time. For example, referring to FIG. 3a, in case of a repeated read operation of the cell where a voltage that is lower than the coercive voltage of the combined FeFET is applied to the WL terminal, the resulting electric field over the ferroelectric capacitor C1 might induce a leakage current Ileak that charges the floating node n1. The result is a change of the effective gate potential of T3, thus yielding a changing current flow between source line and bit line terminals SL and BL, respectively, of the combined memory cell. Such charging effect may eventually lead to a loss of the stored information.

Moreover, even under zero applied electric potential between the WL terminal and SL/BL/PW terminals of the memory cell, the polarization state of the ferroelectric capacitor C1 might lead to a non-zero electric potential at node n1 which induces an electrical field drop at the gate of the transistor T3 or at the ferroelectric capacitor C1, which may induce a leakage current Ileak that eventually charges the floating node n1.

Such leakage currents which charge/discharge the floating node n1 can alter the stored information over time, thus limiting the retention time of the memory cell. That is, the inevitable leakage current that occurs in real devices in combination with a floating storage node may prevent the adoption of such combined memory cells for non-volatile data storage.

SUMMARY

The present disclosure provides examples of an integrated circuits for sensing a polarization state of small-scaled memory elements having a polarizable material as a storage layer. In examples, the sensing of the polarization state of small scaled capacitors or tunnel junctions, which have only a small amount of switching charge or small read currents, is provided by employing a read transistor, in addition to a select transistor, within a memory cell to amplify a read signal to be sensed by a sense amplifier (SA). Additionally, according to examples, the present disclosure provides solutions to issues of alteration of stored information in a memory cell due to leakage currents.

In accordance with one example implementation described herein, an integrated circuit includes a memory cell having a capacitor, a transistor, and a third circuit element which is adapted as a selector device, which together form a 1T1S1C polarizable memory cell. In one example, the capacitor includes electrodes made from metal or a semiconductor material or conductive oxides and a polarizable material layer and might include additional dielectric layers In accordance with examples of the present disclosure, the capacitor includes polarizable material which may be one of a ferroelectric material, an antiferroelectric material, and a relaxor type ferroelectric material.

According to examples of the present disclosure, the memory cell includes a capacitor having a polarizable material (polarizable capacitor) connected in series to a gate of a transistor and an additional circuit element in the memory cell enabling direct control of an electrical potential of a connection, or node, between one terminal of the polarizable capacitor, the gate of the transistor, and the third circuit element, where the third circuit may include one of a transistor, a resistor, and a diode which enables direct control of the electrical potential of the otherwise floating node (e.g., see node n1 of FIG. 4a).

In accordance with one example of the present disclosure, the third circuit element may be a second transistor having one of a source and drain connected to the gate of the first transistor (e.g., see FIG. 4a, T3) which is connected to one electrode of a capacitor (node n1), the capacitor including a polarizable material. In examples, node n1 may be powered via the second transistor by a control circuit such that an electrical potential of node n1 is fixed during a write operation so that an effective write voltage of the memory cell is independent of a capacitive voltage divider ratio formed by a gate capacitance of the first transistor T3 and the capacitor, such that the effective write voltage is determined only by the coercive voltage of the capacitor. Additionally, in other examples, prior to a read operation, the electrical potential of n1 can be set to a predefined value which is independent of any accumulated leakage current during a retention time, where such retention time is the time since the last write time. No loss of data due to accumulated leakage current will occur at node n1.

In accordance with examples of the present disclosure, in such a memory cell the effective coercive voltage of the memory cell is independent of the capacitive voltage divider between polarizable capacitor and gate of the read transistor T3. In that way the size of the polarizable capacitor can be varied in a much larger range to optimize the cell design for different applications. In accordance with this invention, increasing the capacitance of C1 or decreasing the gate capacitance of T3 will yield a much larger voltage shift upon polarization reversal of C1 during read operation thus yielding a much larger memory window of the memory cell without increasing the effective coercive voltage of the memory cell.

In accordance with some examples of the present disclosure, more than one capacitor comprising a polarizable material may be connected to node n1 to increase the memory density without deteriorating the effective coercive voltage of the memory cell. Such a concept allows to perform a read operation of multiple capacitors comprising a polarizable material simultaneously leading to a combined read out result of multiple stored information, referred to as "bits". Thus, a logic operation between the multiple stored bits can be performed inside the memory cell.

In accordance with examples of the present disclosure, impedance matching for a non-destructive readout operation may be performed by measuring the polarization dependent leakage current flowing through the polarizable capacitor (e.g., a ferroelectric capacitor) upon application of a read out voltage smaller than the coercive voltage of the polarizable capacitor. This concept is also referred to herein as a polarizable tunnel junction (PTJ). Since the capacitance of node n1 is mainly determined by polarizable capacitor C1 and a small gate capacitance of the read transistor T3 (without the need of any bit line connected directly to n1), a very small read current can be used to alter the potential at node n1 during read operation without the need to switch the polarization of the polarizable capacitor. Further, an internal gain that originates from a trans-conductance of the read transistor T3 of the memory cell may be used to amplify the read signal, thus enabling the fast read operation for very small polarizable tunnel junctions (PTJs) typically featuring a low read current density.

In one example of the present disclosure, the polarizable material of the polarizable capacitor of the polarizable tunnel junction is a ferroelectric material and the tunnel junction is ferroelectric tunnel junction (FTJ). According to one example, a non-destructive readout operation is performed by measuring the polarization dependent leakage current flowing through the ferroelectric capacitor upon application of a read out voltage smaller than the coercive voltage of the ferroelectric capacitor. In another example, the polarizable material of the tunnel junction is an anti-ferroelectric material or a relaxor type material and the tunnel junction is an anti-ferroelectric tunnel junction (AFTJ) or a relaxor type tunnel junction (RTJ).

Without constraints, the polarizable capacitor and the polarizable tunnel junctions as described herein may be used as a memory cell or memory element without the transistor and selector device as described herein. In accordance with the present disclosure, the polarizable tunnel junction capacitor includes a resonant tunneling barrier between the polarizable material and one electrode of the tunnel junction. In another example of the present disclosure, the polarizable material of the tunnel junction comprises an antiferroelectric material or a relaxor type material and the tunnel junction comprises an antiferroelectric tunnel junction (AFTJ) or a relaxor type tunnel junction (RTJ).

BRIEF DESCRIPTION OF THE DRAWINGS

FIG. 4b is a schematic diagram generally illustrating an example of a memory array constructed of a multitude of 1T1S1C ferroelectric memory cells as depicted in FIG. 4a FIG. 5a is a voltage-time diagram illustrating an example of the operation of the 1T1S1C ferroelectric memory cell of FIG. 4a.

FIG. 5b is a voltage-time diagram illustrating another example of the operation of the 1T1S1C ferroelectric memory cell of FIG. 4a.

FIG. 6c is a schematic diagram generally illustrating an example of a memory array constructed of a multitude of 1T1S1C ferroelectric memory cells as depicted in FIG. 6a or FIG. 6b.

FIG. 7 is a voltage-time diagram illustrating an example of the operation of the 1T1S1C ferroelectric memory cell of FIG. 6a.

FIG. 8b is a schematic diagram generally illustrating an example of a memory array constructed of a multitude of 1T1S1C ferroelectric memory cells as depicted in FIG. 8a FIG. 9 is a voltage-time diagram illustrating an example of the operation of the 1T1S1C ferroelectric memory cell of FIG. 8a.

FIG. 10b is a schematic diagram generally illustrating an example of a memory array constructed of a multitude of 2T2S2C ferroelectric memory cells as depicted in FIG. 10a.

FIG. 11a is a voltage-time diagram illustrating an example of the operation of the 2T2S2C ferroelectric memory cell of FIG. 10a.

FIG. 11b is a voltage-time diagram illustrating another example of the operation of the 2T2S2C ferroelectric memory cell of FIG. 10a.

DETAILED DESCRIPTION

As described herein, a polarizable memory cell includes a capacitor having electrodes made from metal or a semiconductor material or conductive oxides and a polarizable material layer, a transistor, and a third circuit element that is adapted as selector device, thus forming a 1T1S1C polarizable memory cell. In accordance with the present disclosure, the polarizable material layer may be a ferroelectric material, an antiferroelectric material or a relaxor type ferroelectric material.

Figure 1:
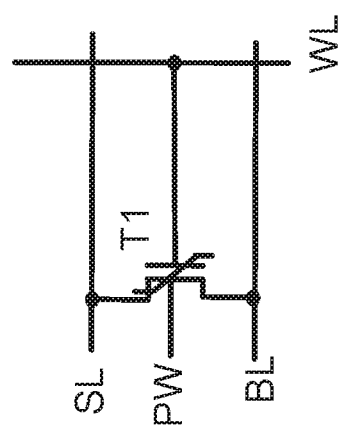
FIG. 1 is a schematic diagram generally illustrating an example of a known FeFET memory cell.
Figure 2A:
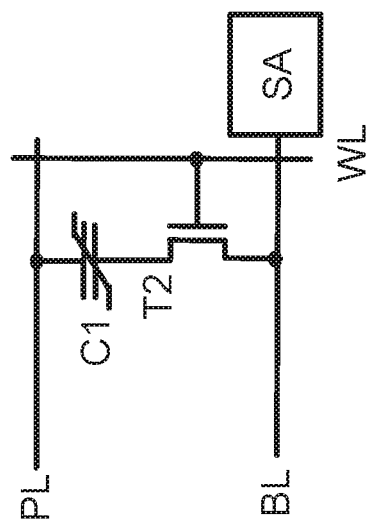
FIG. 2a is a schematic diagram generally illustrating an example of a known 1T1C FeRAM memory cell.
Figure 2B:
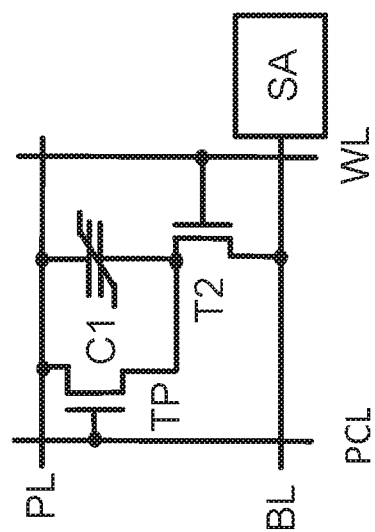
FIG. 2b is a schematic diagram illustrating an example of a known 2T1C FeRAM memory cell.
Figure 2C:
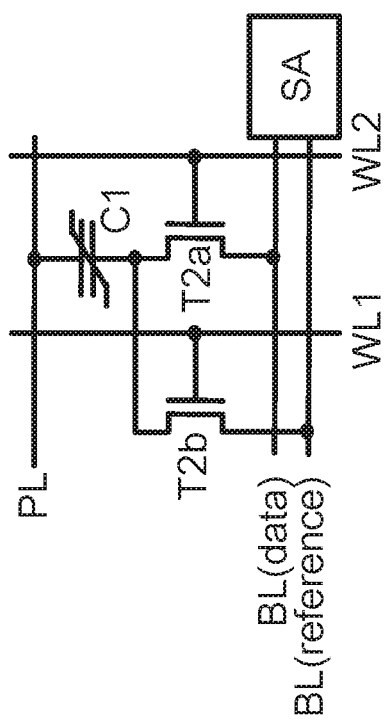
FIG. 2c is a schematic diagram illustrating another example of a known 2T1C FeRAM memory cell.
Figure 3A:
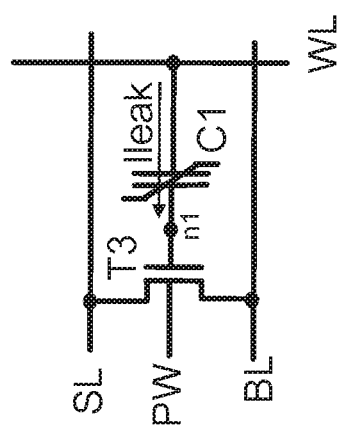
FIG. 3a is a schematic diagram generally illustrating an example of a known 1T1C ferroelectric memory cell where a FeFET is realized by connecting a ferroelectric capacitor to the gate of a FET
Figure 3B:
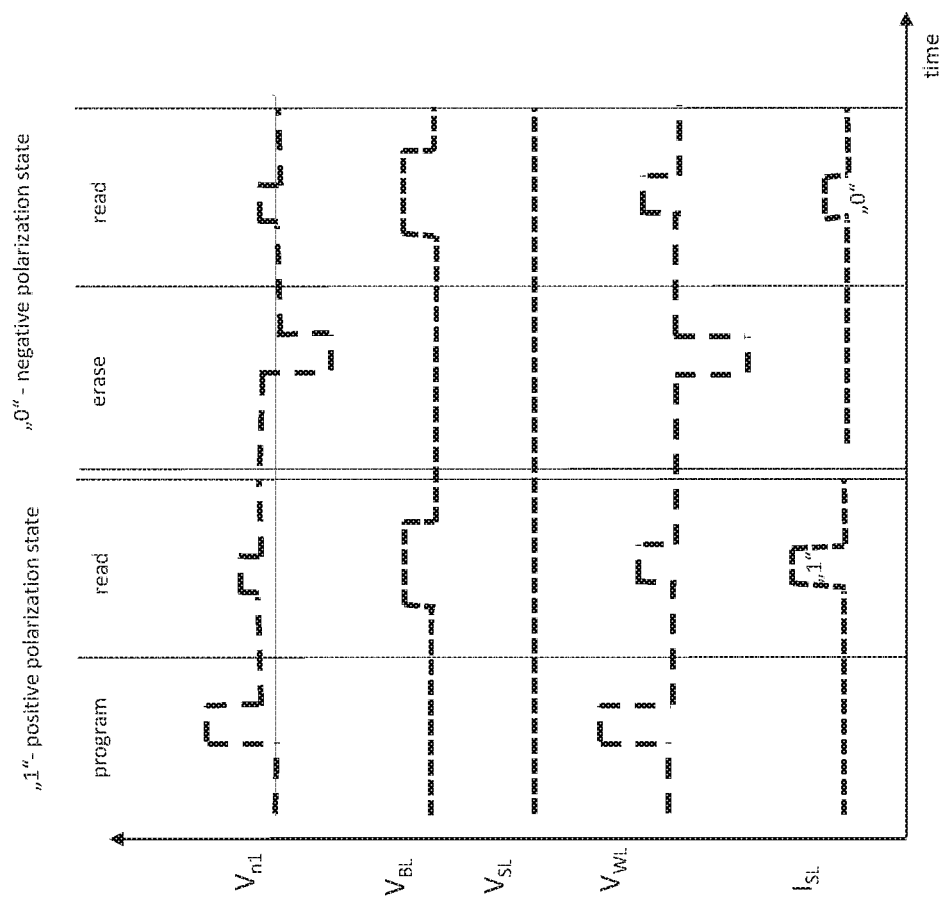
FIG. 3b is a voltage-time diagram illustrating an example of the operation of the 1T1C ferroelectric memory cell of FIG. 3a FIG. 4a is a schematic diagram generally illustrating an example of a 1T1S1C ferroelectric memory cell according to one example of the present disclosure where a selector element is realized as a transistor.
Figure 4A:
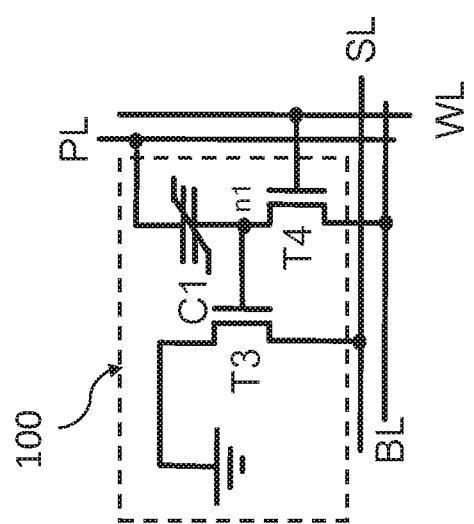

FIG. 4a schematically depicts a ferroelectric memory cell 100, according to one example of the present disclosure. Memory cell 100 includes a ferroelectric capacitor C1 connected between a plate line terminal PL of the memory cell and a gate of a read transistor T3, wherein the connection forms an electrical circuit node n1. One of the source and drain terminals of read transistor T3 is connected to a source line SL terminal of the memory cell, whereas the other of the source and drain terminals of the read transistor T3 is connected to a fixed voltage reference, for example to a ground terminal as is exemplarily shown in FIG. 4a. It is noted that when using the term source/drain terminal herein, if the first terminal of the transistor T3 is the source, the second terminal of the transistor T3 is the drain, both of which are independent of the gate of the transistor, where the gate is the third terminal of the transistor. Likewise, if the first terminal of the transistor is the drain terminal, the second terminal of the transistor T3 is the source terminal, both of which are independent of the gate of the transistor T3. As such, connectivity of the source and drain terminals of transistor T3 can be interchanged without a loss of functionality.

Additionally, one of the source/drain terminals of a select transistor T4 is connected to node n1, with the other of the source/drain terminals of T4 being connected to the BL terminal of the memory cell. The gate of the select transistor T4 is connected to the word line WL terminal of the memory cell. A 1T1S1C memory cell is formed.

In one example, as illustrated by FIG. 4a, a memory array 110 is formed by connecting a multitude of 1T1S1C memory cells 100. In such fashion, many 1T1S1C memory cells 100 are connected to the word lines, bit lines, source lines and plate lines.

Figure 5A:
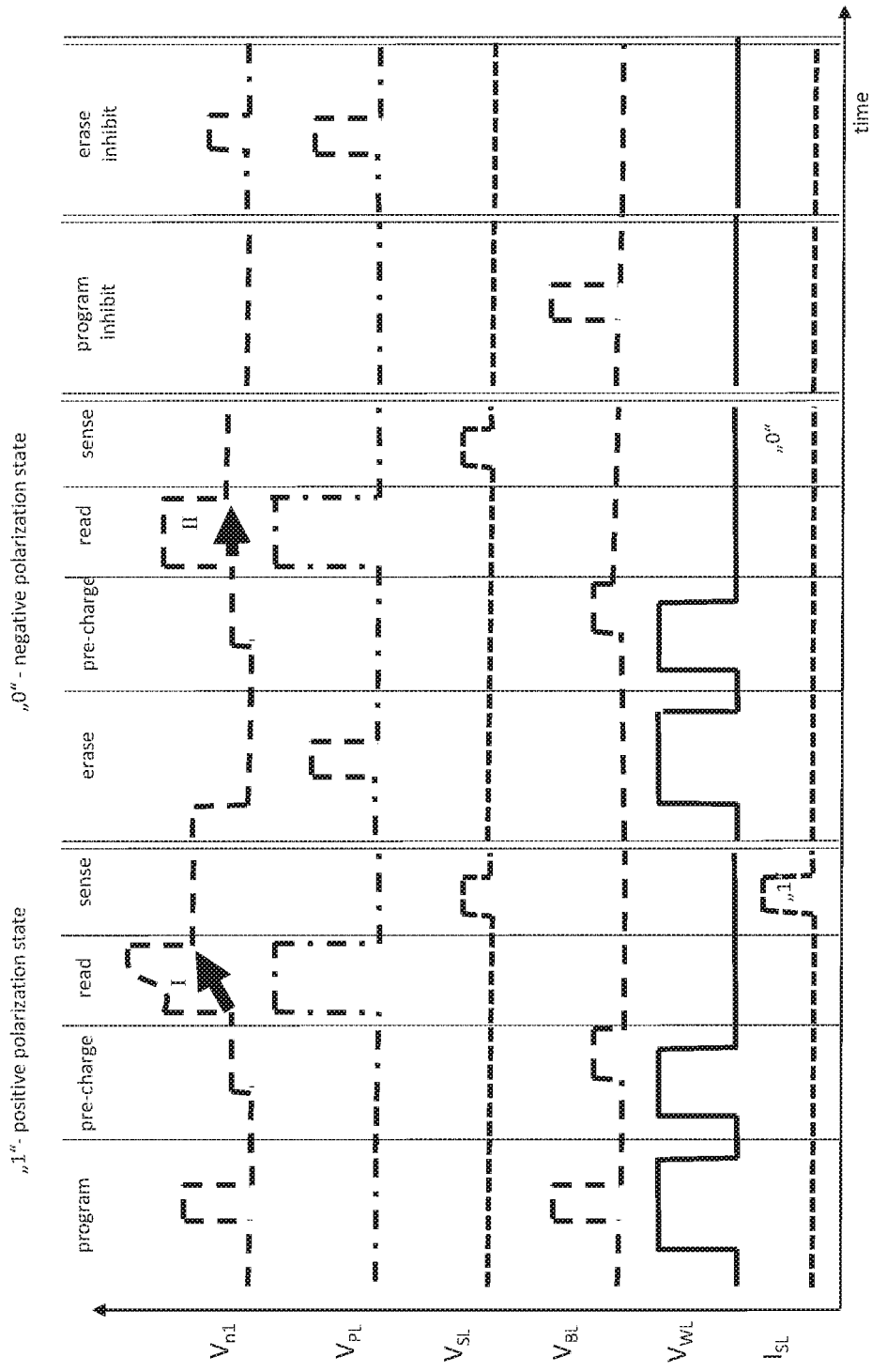

FIG. 5a is a voltage-time diagram illustrating the operation of the 1T1S1C ferroelectric memory cell 100 arranged in a memory array 110, according to one example.

When switching on the select transistor T4 by applying a suitable electrical potential at the WL terminal, BL is connected to circuit node n1 via T4. For example, assuming T4 is a NFET device having a threshold voltage of $V_{TH4}=0.5V$, T4 is switched on by applying a voltage to the WL terminal that is more positive than the applied BL voltage by at least the threshold voltage of T4. For example, if the BL voltage is set to 0V, a suitable WL voltage would be 1V to switch on T4. In another example, if the BL voltage is set to 1.5V, a suitable WL voltage would be 2.5V to switch on T4. In another example, assuming T4 is a PFET device, T4 is switched on by applying a voltage to the WL terminal that is more negative than the applied BL voltage by at least the threshold voltage of T4.

After T4 is switched on, a reversal of the ferroelectric polarization of C1 is performed by applying a positive or negative voltage difference between the PL and BL terminals of the memory cell, where the applied potential difference between PL and BL is larger than the coercive voltage of the ferroelectric capacitor C1. For example, if the coercive voltage of C1 is $V_{CC1}=1V$, a suitable voltage amplitude to be applied between PL and BL would be V=1.5V.

For example, in a case where a more positive electric potential is applied to the PL as compared to the BL, the ferroelectric capacitor C1 is switched to the negative polarization state, thus representing an erased logic state "0". In contrast, in a case where a more negative electric potential is applied to the PL as compared to the BL, the ferroelectric capacitor C1 is switched to the positive polarization state, thus representing a programmed logic state "1".

For a read operation, in a first step, the node n1 is pre-charged via the select transistor T4 to a certain potential that is applied to the BL terminal. In one example, for such a pre-charge operation, a suitable electrical potential is applied to the WL terminal to switch on T4 such that the pre-charge potential is transferred from the BL to the node n1. For example, if the pre-charge voltage that is applied to the BL is 0.5V and the threshold voltage of T4 is $V_{TH4}=0.5V$, then a suitable WL voltage would be 1.5V to switch on T4. After a certain pre-charge time, T4 is switched returned to the off state by applying another suitable voltage to the WL terminal, such as 0V, for example. In one example, the pre-charge potential is chosen in a way such that the read transistor T3 is switched on partially below or above the threshold voltage of T3, or in another example, that transistor T3 is switched off. For example, if the threshold voltage of T3 is $V_{TH3}=0.3V$, by pre-charging node n1 to 0.05V transistor T3 will be switched on and will operate in a linear region with approximately a linear gate voltage to drain current characteristic. In another example, if the threshold voltage of T3 is $V_{TH3}$=0.3V, by pre-charging node n1 to 0V, transistor T3 will be switched off and will be operated in the sub-threshold region with an exponential gate voltage to drain current characteristic.

In a second step of the read operation, a voltage pulse is applied to the PL terminal of the memory cell while T4 is switched off. The electric potential at node n1 will change according to a capacitive voltage divider that forms between the ferroelectric capacitor C1 and a gate capacitance of read transistor T3. In one example, an amplitude of the voltage pulse at PW is chosen in a way that a resulting potential difference between PL and node n1 exceeds the coercive voltage of ferroelectric capacitor C1, such that, depending on the previously stored polarization state of C1, a ferroelectric polarization reversal is induced.

For example, in a case where C1 was previously programmed to a positive polarization state to store a logic "1", by applying a positive read voltage to the PL terminal, a polarization reversal to the negative polarization state of C1 will occur. Such polarization reversal will induce a polarization current that charges node n1. Therefore, after applying a positive voltage pulse to PL, the potential of node n1 will rest at a relatively higher electric potential as compared to the pre-charge value of node n1, as is indicated by the arrow "I" in FIG. 5a. In contrast, in a case where C1 was previously written to the negative polarization state to store a logic "0", after applying a positive read voltage pulse to PL, the potential of node n1 will rest at approximately the pre-charge value, as is indicated by the horizontal arrow "II" in FIG. 5a.

In one example, when using similar values of the capacitance of C1 and of the gate of transistor T3, the capacitive voltage divider ratio will be about 0.5. Assuming further a coercive voltage of C1 of $V_{CC1}$=1V, a pre-charge voltage of 0V for node n1, and a resting voltage of PL of 0V, a voltage pulse of $V_{PW}$=2.2V would yield a voltage at node n1 of 1.1V and a voltage difference between PL and n1 of 1.1V, thus exceeding the coercive voltage of C1. Those skilled in the art will appreciate that the operation conditions of the memory cell can be adjusted by changing the capacitive voltage divider ratio, the pre-charge voltage of n1, the pulse amplitudes of PL, and the like, such that operation of the memory cell 100 can be optimized for a large variety of different applications and boundary conditions coming, for example, from the sense amplifier design that might be connected to the SL.

Figure 4B:
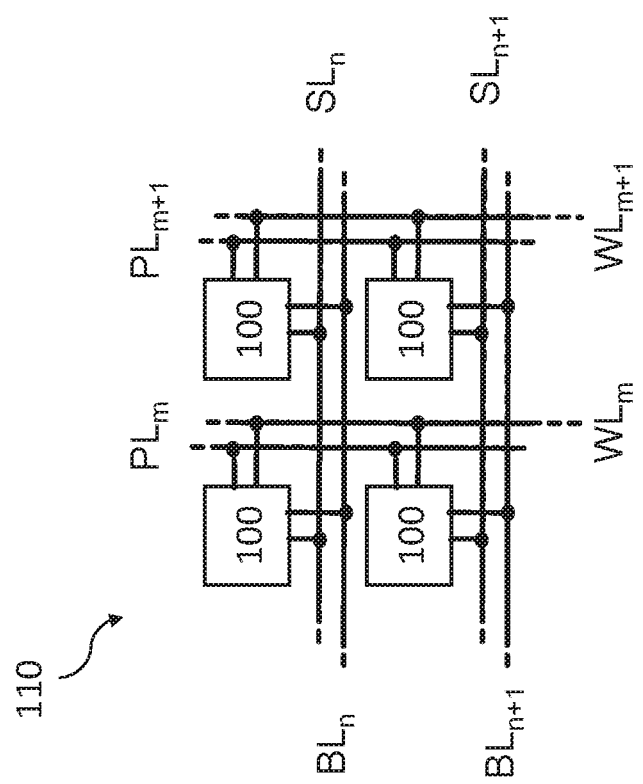

In one example, in a third step of a read operation, to sense the memory state of the 1T1S1C memory cell, a drain voltage is applied to read transistor T3 via the SL terminal of memory cell 100. As a result, a current will flow between SL and the ground terminal that depends on the electric potential of n1 after the two first steps of the read operation which, thus, depends on the previously stored polarization state of the ferroelectric capacitor C1. In one example, the current flow can be sensed using a sense amplifier connected to the SL (not shown in FIG. 4a and FIG. 4b). For example, in a case of a logic "1" having been stored as a positive polarization state of C1, a relative larger current will be sensed at the SL by the sense amplifier as compared to a case of a logic "0" having been stored as a negative polarization state of C1.

In one example, after a read operation, the ferroelectric capacitor C1 is erased to a negative polarization state. Thus, such a read operation is also sometimes referred to as a destructive readout. As a result, a logic data is written back into the memory cell, which can be performed in a similar way as was described above for the write operation.

It is known that the leakage current flowing through ferroelectric capacitor C1 when applying an electric potential to its two terminals may depend on the polarization state of the ferroelectric capacitor. For example, in a case where the ferroelectric capacitor is switched to the negative polarization state, thus representing an erased logic state "0", a relatively lower leakage current will flow through the capacitor when applying a non-zero voltage to its two terminals, as compared to a case where the ferroelectric is switched to the positive polarization state, thus representing a programmed logic state "1", or vice versa. Such difference in leakage current is present especially for a case when a voltage lower than the coercive voltage of the ferroelectric capacitor is applied to its two terminals. A ferroelectric capacitor that exhibits such electrical behavior is sometimes referred to as ferroelectric tunnel junction.

Figure 5B:
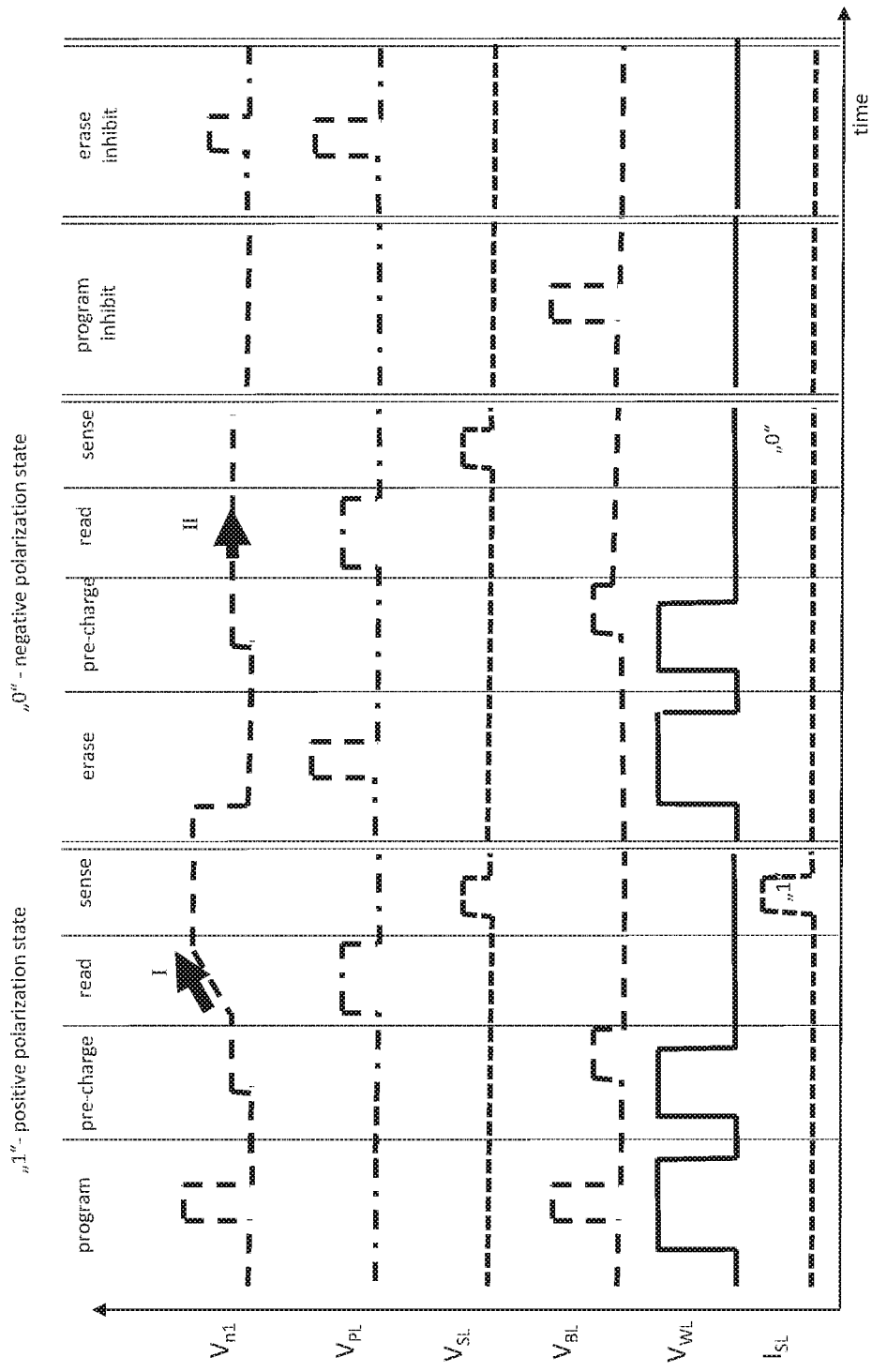

FIG. 5b is a voltage-time diagram illustrating the operation of the 1T1S1C ferroelectric memory cell 100 arranged in a memory array 110, according to another example.

It is noted that a write operation is performed similar to that described with regard to the first example of FIG. 5a. However, for a read operation, in a first step, node n1 is pre-charged via select transistor T4 to a suitable potential that is applied to the BL terminal. For the pre-charge operation, a suitable electrical potential is applied to the WL terminal to switch on T4 such that the pre-charge potential is transferred from the BL to node n1. After a suitable pre-charge time, T4 is switched back to the off state by applying another suitable voltage to the WL terminal—such as 0V, for example. In one example, the pre-charge potential is chosen in a way that the read transistor T3 is switched on partially below or above the threshold voltage of T3, or in another example, such that transistor T3 is switched off.

In a second step of the read operation, a voltage pulse is applied to the PL terminal of the memory cell while T4 is switched off. As a result, the electric potential at node n1 will change according to a capacitive voltage divider that forms between the ferroelectric capacitor C1 and the gate capacitance of read transistor T3. In one example, an amplitude of the voltage pulse at PW is chosen such that a resulting potential difference between PL and node n1 does not exceed the coercive voltage of ferroelectric capacitor C1 such that, depending on the previously stored polarization state of C1, a leakage current will flow through the capacitor that changes the potential at node n1.

For example, in a case where C1 was previously programmed to the positive polarization state to store a logic "1", by applying a positive read voltage to the PL terminal a relatively larger leakage current will flow. Therefore, after applying a positive voltage pulse to PL, the potential of n1 will rest at a relatively higher electric potential compared to the pre-charge value, as is indicated by the arrow "I" in FIG. 5b. In contrast, in a case where C1 was previously written to the negative polarization state to store a logic "0", after applying the positive read voltage pulse to PL, the potential of n1 will rest at about the pre-charge value, as is indicated by the horizontal arrow "II" in FIG. 5b.

It is to be understood that the potential difference between PL and n1 might be positive or negative, thus inducing a positive or negative leakage current flowing through C1. Hence, the potential of n1 will either increase or decrease during a read operation depending on the potential difference between PL and n1. It is further to be understood that the potential difference between PL and n1 can be adjusted either by a pre-charge operation that defines the potential at n1, or by applying a respective voltage to PL during a read out operation, or by combining both measures.

According to one example, to sense the memory state of the 1T1S1C memory cell, in a third step, a drain voltage may be applied to read transistor T3 via the SL terminal of the memory cell. In that way, a current will flow between SL and the ground terminal which depends on the electric potential of n1 after the two first steps of the read operation and, thus, depends on the previously stored polarization state of the ferroelectric capacitor C1. The current flow may be sensed, for example, by a sense amplifier that is connected to the SL. For example, in case of a logic "1" being stored as a positive polarization state of C1, a relatively larger current can be sensed at the SL by the sense amplifier, as compared to the case of a logic "0" being stored as a negative polarization state of C1.

In one example, to prevent write operations in unselected cells, the WL potential of unselected cells is kept at a voltage that causes the select transistor T4 to be switched off during the programming phase. In that way, any programming pulse at the BL will have no effect on the electric potential of n1 and, thus, would not induce a polarization reversal of C1. Moreover, a program or erase pulse at PL would cause a change of the potential at n1 that is determined by a capacitive voltage divider that forms between C1 and the gate capacitance of T3. By proper design of such capacitive voltage divider, it can be ensured that the potential drop over C1 is below the coercive voltage of the ferroelectric capacitor C1. In that way, a programming pulse at the BL would have no effect on the electric potential of n1 and, thus, not induce a polarization reversal of C1.

It is to be understood that the voltage-time diagrams depicted in FIG. 5a and FIG. 5b are provided for illustrative purposes only to illustrate examples of operational principles of the example ferroelectric memory cell.

It is further to be understood that additional control signals may be applied to the WLs, BLs, SLs or PLs in the memory array to improve the programming or read conditions and to mitigate read or write disturb effects. For example, the potential of n1 of each passive memory cell connected to one BL may be pre-charged to a potential that causes T3 of each of the passive cells to be turned off during a read operation. In that way, unwanted leakage currents flowing via passive cells to the SL that would deteriorate the signal-to-noise ratio for the SA are prevented.

It is further to be understood that the polarization state of the ferroelectric capacitor C1 may be switched to an intermediate polarization state where a first portion of the ferroelectric material might be polarized to the positive polarization state, a second portion of the ferroelectric material might be polarized to the negative polarization state, and a third portion of the ferroelectric material might be un-polarized. In that way, depending on the relation of positively, negatively or un-polarized material, a multitude of different polarization levels can be programmed into the ferroelectric capacitor C1. In that way, more than two logical values can be stored into the ferroelectric capacitor C1. During a readout operation of the ferroelectric memory cell, such intermediate polarization states can be represented as intermediate voltage levels at node n1 or as intermediate source line read current levels ISL.

Figure 6A:
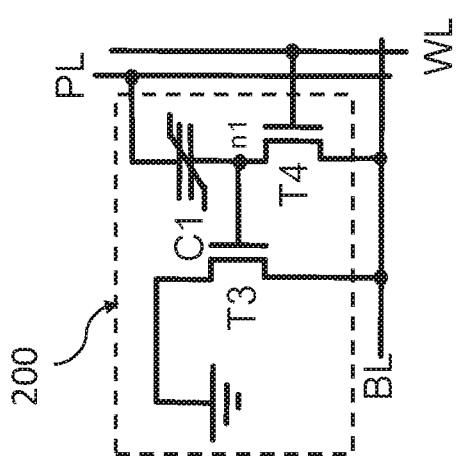
FIG. 6a is a schematic diagram generally illustrating an example of a 1T1S1C ferroelectric memory cell according to one example of the present invention where a selector element and a read transistor are both connected to a bit line.
Figure 6B:
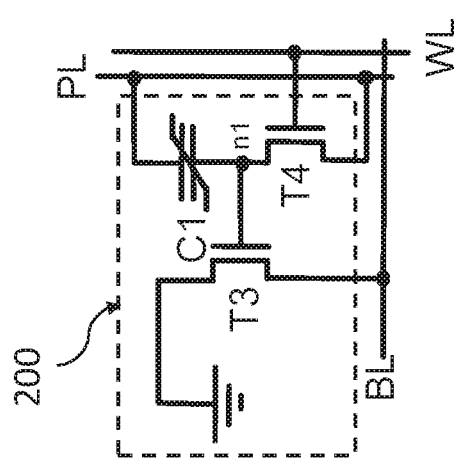
FIG. 6b is a schematic diagram generally illustrating a 1T1S1C ferroelectric memory cell according to one example of the present disclosure where a selector element is connected in parallel with a storage capacitor

FIG. 6a schematically illustrates a ferroelectric 1T1S1C memory cell 200 schematically according to one example of the present disclosure. According to such example, the first source/drain terminal of read transistor T3 is connected to the BL. FIG. 6b schematically illustrates a ferroelectric 1T1S1C memory cell 200 according to another example of the present disclosure. According to such example, the second source/drain terminal of select transistor T4 is connected to the PL. In the configurations of FIG. 6a and FIG. 6b, the SL can be omitted, thus reducing the wiring complexity of the memory array.

FIG. 6c generally illustrates a memory array 210 formed by connecting a multitude of 1T1S1C memory cells 200. In such fashion, many 1T1S1C memory cells 200 may be connected to the word lines, bit lines and plate lines.

According to examples, read and write operations of the 1T1S1C memory cell of FIG. 6a to set the polarization state of C1 are accomplished in fashions similar to that described in the first example for memory array 110. However, to ensure that no large current flows from BL through the read transistor T3 during a program operation, in one example, the BL voltage is chosen such that the resulting voltage between the source and drain terminals of read transistor T3 is close to zero.

Figure 7:
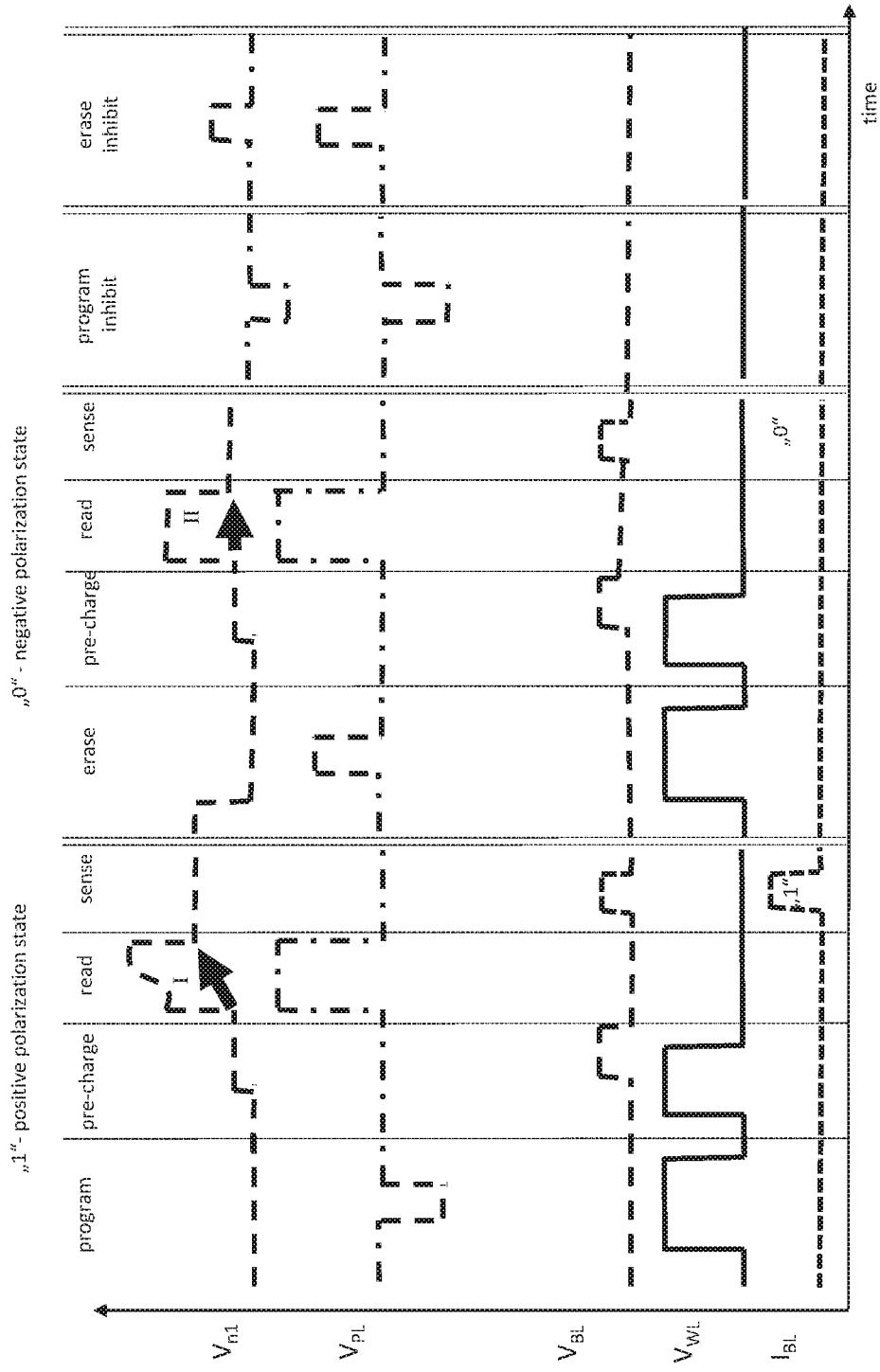

FIG. 7 is a voltage-time diagram illustrating an example of the operation of the 1T1S1C ferroelectric memory cell 200 arranged in a memory array 210.

In one example, a program operation of memory cell 200 in memory cell array 210 is performed by applying a programming pulse with negative amplitude to the PW terminal instead of applying a programming pulse with positive amplitude to the BL of the memory cell 200. In that way, the ferroelectric capacitor will be programmed to the positive polarization state, thus representing a logic state "1", while the BL terminal can be kept for example, at ground potential.

It is to be understood that the fixed potential connected to the second source/drain terminal of T3 might be different from the ground potential. Also, the BL voltage during program operation might be chosen to be different from the ground potential as well while still ensuring a low current flow through T3 during a program/erase operation.

In another example, during a program operation of memory cell 200 in memory cell array 210, the fixed potential that is applied to the second source/drain terminal of read transistor T3 may be chosen to be in the range of the coercive voltage of the ferroelectric capacitor C1. In that way, the BL voltage is set to a voltage similar to the coercive voltage of C1 during write operation as well. Negative or positive polarization state of C1 is then induced by applying 0V or two times the coercive voltage of C1 to the PL terminal of the memory cell. In that way, the memory cell is programmed and erased by applying only pulses with positive voltage polarity to the different terminals of the memory cell.

Figure 8A:
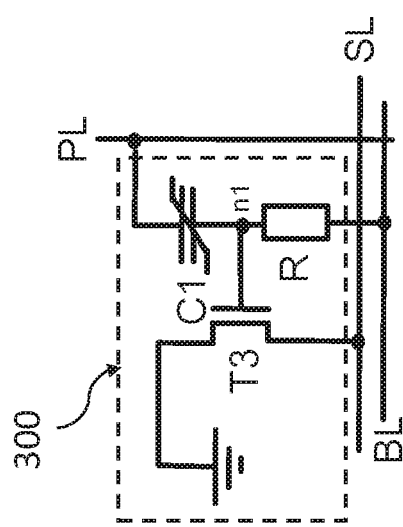
FIG. 8a is a schematic diagram generally illustrating an example of a 1T1S1C ferroelectric memory cell according to one example of the present invention where a selector element is realized as a resistor

In another example of the present disclosure, the select transistor T4 of the combined ferroelectric memory cell is replaced by a two terminal selector device, such as a diode, a resistor or the like, that might have a linear or a non-linear current-voltage characteristic, thus forming a 1T1S1C ferroelectric memory cell. As illustrated by the example of FIG. 8a, a first terminal of resistive device R is connected to node n1, and the second terminal for example, is connected to the bit line BL. In that way, the potential at node n1 will be controlled by the BL potential via R during a hold time and can be pre-charged during read operation.

Figure 8B:
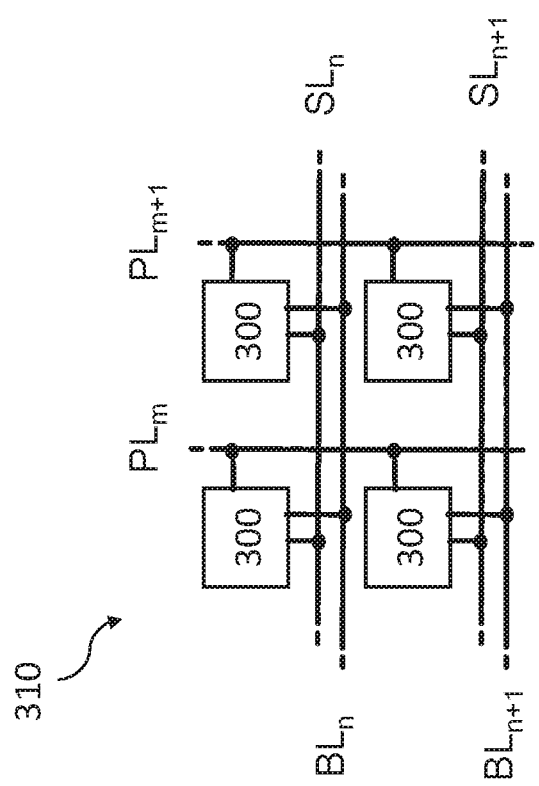

In example, as illustrated by FIG. 8b, a memory array 310 is formed by connecting a multitude of 1T1S1C memory cells 300. In that way, many 1T1S1C memory cells 300 may be connected to the source lines, bit lines and plate lines.

Figure 9:
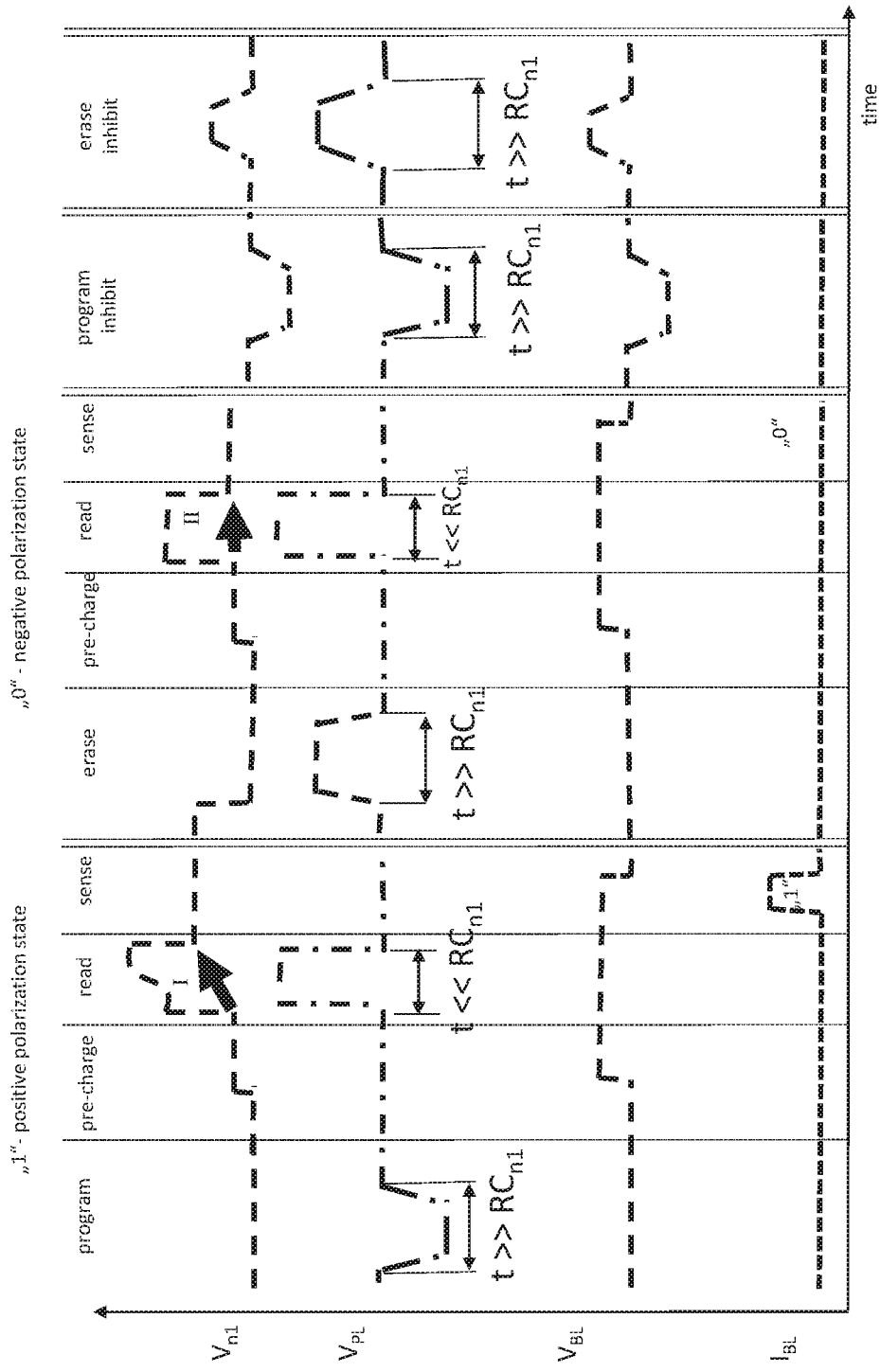

FIG. 9 is a voltage-time diagram illustrating an example for the operation of the 1T1S1C ferroelectric memory cell 300 arranged in a memory array 310.

During write operation, in order to switch the ferroelectric polarization of C1, a positive or negative potential is applied to PL such that the potential difference between n1 and PL exceeds the coercive voltage of the ferroelectric capacitor. For example, for pulses that have a duration significantly longer than the RC-delay time (where such RC-delay calculates approximately as the product of resistance R and the capacitance of the floating node $C_{n1}$), the potential at n1 will stay at about the BL potential. For such long pulses, the capacitive voltage divider that forms between C1 and the gate of T3 will have negligible influence on the potential at node n1.

For example, if the capacitor C1 has a capacitance of about 100 fF and the resistance of R is about 1MΩ, the resulting RC-delay time would be in the range of 100 ns. Therefore, when applying a programming pulse with a duration of, for example, 10 µs and a rise and fall time of the pulse edges, for example, of 1 µs, the potential of node n1 will stay at about the BL potential.

During a read operation, in order to switch the ferroelectric polarization of C1, a positive or negative potential is applied to PL such that the potential difference between n1 and PL exceeds the coercive voltage of the ferroelectric capacitor. For example, for pulses that have a duration that is significantly shorter than the RC-delay time (where such RC-delay calculates approximately as the product of resistance R and the capacitance of the floating node $C_{n1}$), the potential at n1 will be determined mainly by the capacitive voltage divider that forms between C1 and the gate of T3. For such short pulses, the resistive element R will have negligible influence on the potential at node n1 and the read operation can be performed in a similar way as was described above for the memory cell 100 in FIG. 4a.

For example, if the capacitor C1 has a capacitance of about 100 fF and the resistance of R is about 1MΩ, the resulting RC-delay time would be in the range of 100 ns. Therefore, when applying a reading pulse to PL with a duration of for example 10 ns and a rise and fall time of the pulse edges for example of 1 ns, the potential of node n1 will be determined mainly by the capacitive voltage divider that forms between C1 and the gate of T3 since the charge compensation via resistive element R is negligible for such short pulse time.

In order to prevent program or erase operation of an unselected cell, the potential at node n1 may be pre-charged via BL to half or one third of the amplitude of the programming pulse that is applied to the PL, for example. In that way the coercive voltage of the ferroelectric capacitor will not be reached, thus preventing programming or erase of unselected memory cells.

It is understood that in another embodiment of the present invention, the second terminal of the resistive element R may be connected to a terminal other than the BL, such as WL or SL, for example, where such terminal can be controlled by a control circuit. In such cases, the operation scheme must be adjusted accordingly.

Figure 10A:
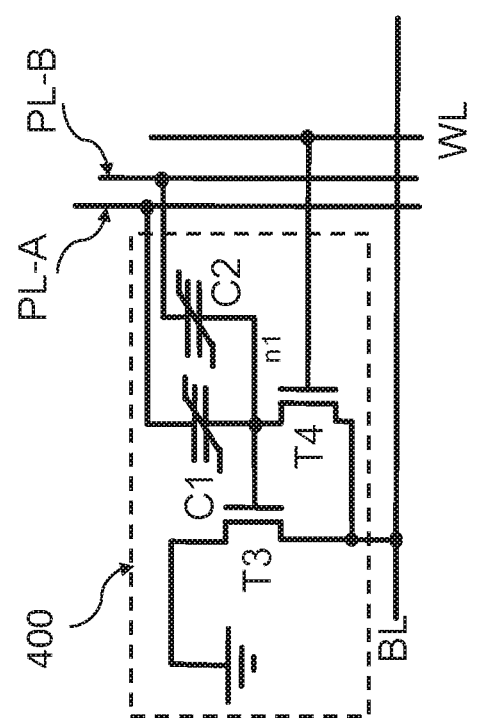
FIG. 10a is a schematic diagram generally illustrating an example of a 1T2S2C ferroelectric memory cell according to one example of the present invention where two selector devices and two storage capacitors are realized within one memory cell.

FIG. 10a schematically illustrates a ferroelectric 1T1S2C memory cell 400, according to another example of the present disclosure. According to one such example, two ferroelectric capacitors C1 and C2 are connected to node n1 of memory cell 400 such that select transistor T4 and read transistor T3 are shared between the two ferroelectric capacitors C1 and C2. Moreover, each of the ferroelectric capacitors C1 and C2 is connected to a respective plate line PL-A and PL-B.

Figure 10B:
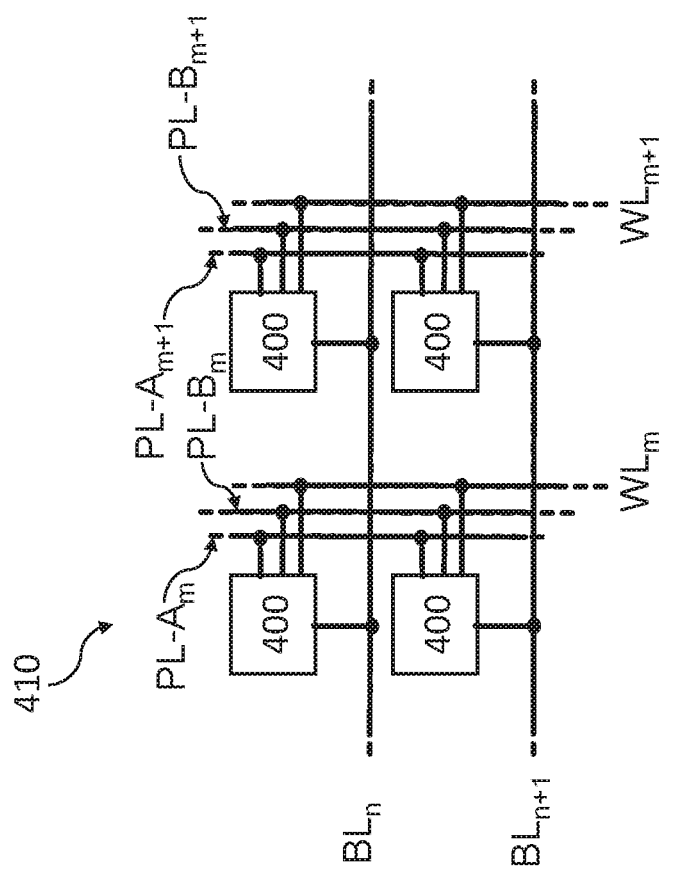

A memory array 410 is formed by connecting a multitude of 1T1S2C memory cells in an arrangement as depicted in FIG. 10b. In that way many 1T1S2C memory cells 400 would be connected to the word lines, bit lines and plate lines.

Figure 11A:
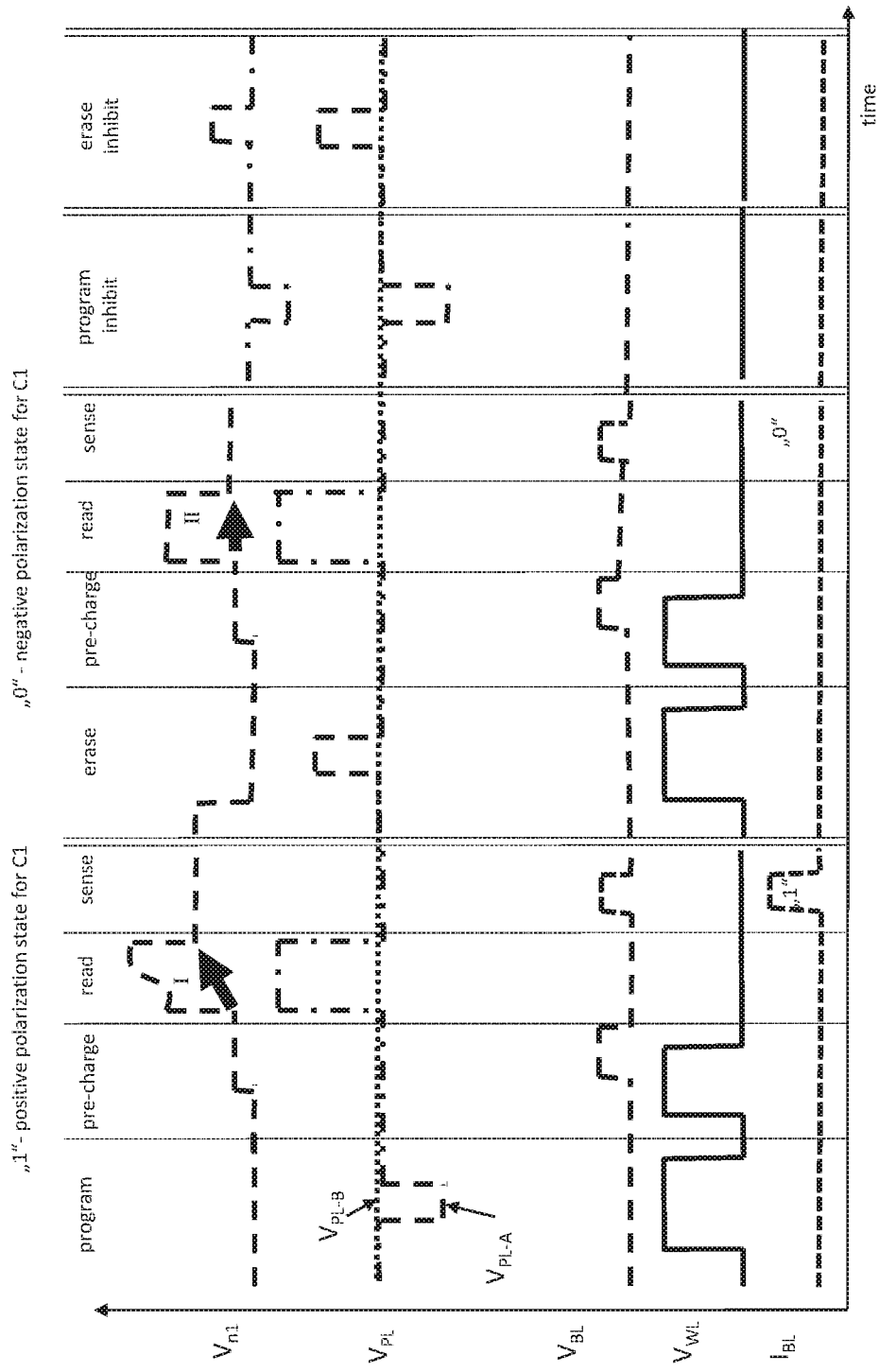

FIG. 11a illustrates a voltage-time diagram of an example of the operation of the 1T1S2C ferroelectric memory cell 400 arranged in memory array 410.

In one example, a read and write operation of the 1T1S2C memory cells is accomplished in a way as similar to that described by the second example for memory array 210. However, to write or read the information of only one ferroelectric capacitor, the write/read signals are applied to only one PL at the time, as is depicted by the example voltage time diagram of FIG. 11a. For example when accessing capacitor C1 of ferroelectric memory cell 400 in FIG. 10a, only PL-A would be used during read/write operations, while PL-B is kept at the resting potential, as is illustrated in FIG. 11a. Similarly, when accessing capacitor C2 of ferroelectric memory cell 400 in FIG. 10a, only PL-B would be used during read/write operations, while PL-A is kept at the resting potential.

It is to be understood that more than two ferroelectric capacitors and more than two plate lines may be used to form a 1T1SxC memory cell, where x denotes the number of ferroelectric capacitors. In that way, the memory cell is used to store more than 2 bits of information while sharing only one select transistor T4 and one read transistor T3 in one memory cell.

In one example, a read out operation of the 1T1SxC memory cell with at least two ferroelectric capacitors can be accomplished in a fashion where two or more capacitors are read out simultaneously. According to such example, a logic operation among the individually stored bits from the different capacitors can be performed. Such logic operation between two bits of a 1T1S2C memory cell will be described as follows for a 1T1SxC memory cell having two ferroelectric capacitors, C1 and C2.

Figure 11B:
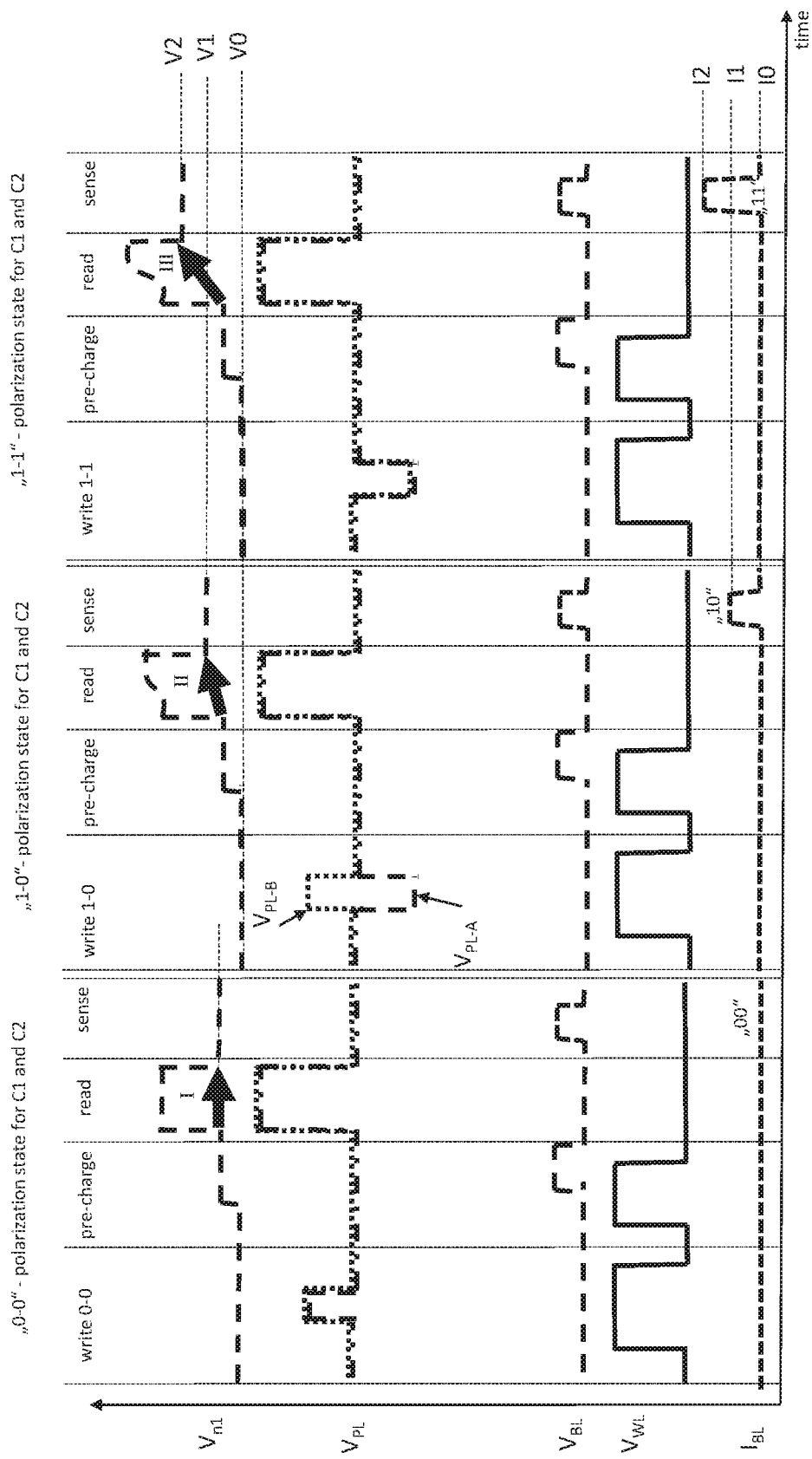

In one example, as depicted in FIG. 11b, in a first case, a logical "0" is written to both ferroelectric capacitors C1 and C2. When performing a readout operation on both capacitors simultaneously, the potential at node n1 will stay approximately at the pre-charge level of V0, corresponding to a low readout current I0 to be sensed at the BL. In a second case, a logical "1" is written to one of the ferroelectric capacitors while a logical "0" is written to the second ferroelectric capacitor. When performing a readout operation on both capacitors simultaneously, the potential at node n1 will increase to an intermediate level of V1, corresponding to an intermediate readout current I1 to be sensed at the BL. In a third case, a logical "1" is written to both ferroelectric capacitors. When performing a readout operation on both capacitors simultaneously, the potential at node n1 will increase to a relatively high level of V2, corresponding to relatively high readout current I2 to be sensed at the BL. In that way, the sensed current at the BL will depend on both logic states that were previously written to both ferroelectric capacitors C1 and C2.

In a case where a sense amplifier connected to the BL is configured in a way that only I2 is considered to represent a logical "1", a logical AND operation is performed between the logical states that were programmed to C1 and C2. In another case where the sense amplifier connected to the BL is configured in a way that only I0 is considered to represent a logical "0", a logical OR operation is performed between the logical states that were programmed to C1 and C2.

It is to be understood that a simultaneous read out operation of two or more capacitors in a 1T1SxC combined ferroelectric memory cell can be performed based on the polarization dependent leakage currents as was discussed for the 1T1S1C combined ferroelectric memory cell. In such case, the leakage currents flowing through the individual ferroelectric capacitors will accumulate at node n1 during a read out operation and, thus, will collectively alter the potential at node n1. In that way, a logic operation between the stored logic states in the individual ferroelectric capacitors can be performed.

Figure 12:
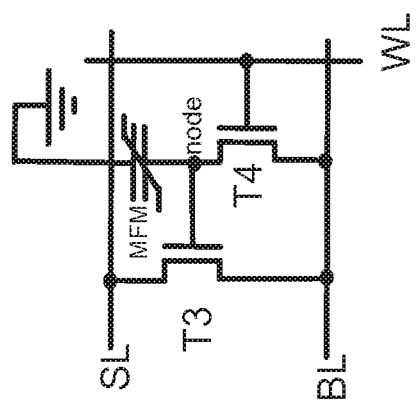
FIG. 12 is a schematic diagram generally illustrating an example of a 1T1S1C ferroelectric memory cell where a second terminal of the storage capacitor is connected to a fixed potential.

In another example of the present disclosure, the second terminal of the ferroelectric capacitor C1 can be connected to a fixed potential, such as to ground potential, as is depicted schematically in FIG. 12. In such a configuration, a write operation to switch the polarization state of the ferroelectric capacitor C1 is performed by switching on T4 and applying a positive or negative voltage to the BL, where such voltage exceeds the coercive voltage of the ferroelectric capacitor C1. In order to read the polarization state of the capacitor C1, the node n1 is pre-charged via T4 and the BL, as was described above. After switching off T4, a positive or negative voltage pulse is applied simultaneously to the SL and BL. In that way, the potential at node n1 will be determined by the voltage pulse amplitude applied simultaneously to SL and BL and the capacitive voltage divider between C1 and the gate of T3. In one example, the amplitude of the voltage pulse is chosen such that the potential at n1 exceeds the coercive voltage of the ferroelectric capacitor so as to induce polarization reversal of C1 depending on the stored logic state.

It is to be understood that the present invention is not limited to the different implementations and corresponding operation schemes of the 1T1SxC combined ferroelectric memory cell as described by the above examples. It is noted that combinations of the different implementations are possible and are understood as further embodiments of the present invention.

In accordance with the present disclosure, the polarizable memory cell comprises a small-scaled polarizable capacitor which has only a small amount of switching charge or small read current. In one example of the present disclosure, the capacitor is a ferroelectric capacitor (FeCAP) using a ferroelectric material as a storage material. In another example of the present disclosure, the capacitor is an antiferroelectric capacitor (AFeCAP) using an antiferroelectric material or a relaxor type material as a storage material. For an AFeCAP, the antiferroelectirc or relaxor type material is sandwiched in the capacitor between two electrodes with different workfunction values. Accordingly, a difference of the workfunction values between the two electrodes induces a built-in (internal) bias electric field that shifts pinched hysteresis loops (PHL) of the antiferroelectric or relaxor type material. In that way, one portion of the P-V hysteresis loop is centered around 0V, thus enabling usage of the AFeCAP as a binary, non-volatile memory element. The ferroelectric material and the antiferroelectric material as used herein, refers to a material that is at least partially in a ferroelectric state or antiferroelectric state and further comprises, as main components, oxygen and any of the group consisting of Hf, Zr and (Hf, Zr).

In accordance with the present disclosure, the polarizable memory cell comprises a small scaled polarizable tunnel junction capacitor which has only a small read current. In one example, the polarizable material of the tunnel junction capacitor is ferroelectric material and the tunnel junction is ferroelectric tunnel junction (FTJ). In another example of the present disclosure, the polarizable material of the tunnel junction is an antiferroelectric material or a relaxor type material and the tunnel junction is an antiferroelectric tunnel junction (AFTJ) or a relaxor type tunnel junction (RTJ). For an AFTJ or a RTJ, the antiferroelectirc or relaxor type material is sandwiched in the capacitor between two electrodes with different workfunction values. Accordingly, the difference of the workfunction values between the two electrodes induces a built-in (internal) bias electric field that shifts pinched hysteresis loops (PHL) of the antiferroelectric or relaxor type material. In that way, one portion of the P-V hysteresis loop is centered around 0V, thus enabling usage of the device as a binary, non-volatile memory element. The ferroelectric material and the antiferroelectric material, as used herein, can refer to a material that is at least partially in a ferroelectric state or antiferroelectric state and further comprises, as main components, oxygen and any of the group consisting of Hf, Zr and (Hf, Zr).

Figure 13:
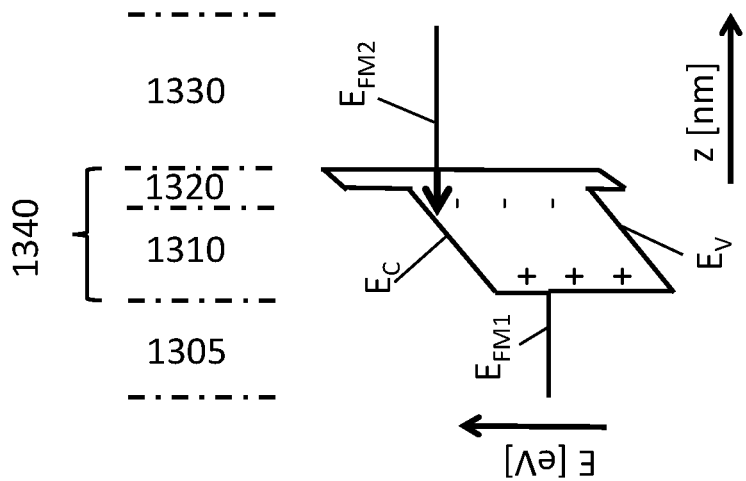
FIG. 13a is a schematic band diagram generally illustrating an on state of a tunnel junction including two electrodes (1305, 1330) and a tunnel barrier (1340) having a two layer stack including a thin dielectric material (1320) and a ferroelectric material (1310). A valence band $E_V$ and a conduction band $E_B$ of the tunneling barrier (1340) having a two layer stack (1310, 1320) and the Fermi levels $E_{FM1}$ and $E_{FM2}$ of the two electrodes (1305, 1330) of the on state are plotted.
FIG. 13b is a schematic band diagram generally illustrating an off state of a tunnel junction including two electrodes (1310, 1330) and a tunnel barrier (1340) having a two layer stack including a thin dielectric material (1320) and a ferroelectric material (1310). A valence band $E_V$ and a conduction band $E_B$ of the tunneling barrier (1340) including a two layer stack (1310, 1320) and the Fermi levels $E_{FM1}$ and $E_{FM2}$ of the two electrodes (1305, 1330) of the off state are plotted.
Figure 13:
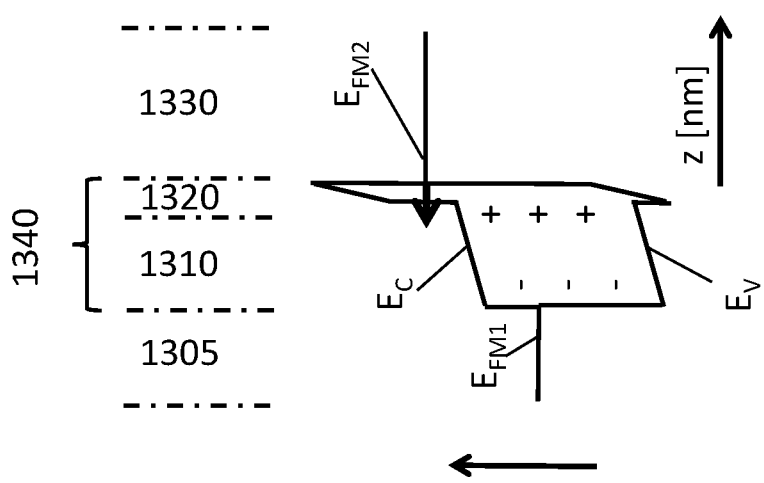
Figure 14:
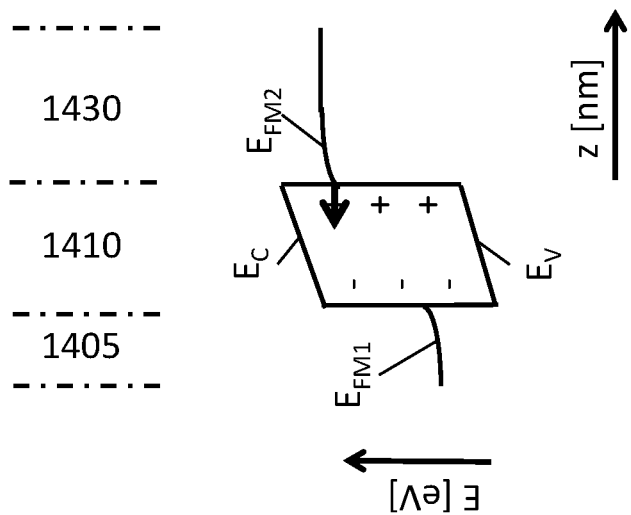
FIG. 14a is a schematic band diagram generally illustrating, in accordance with the present disclosure, the on state of a tunnel junction including two electrodes (1405, 1430) and a tunnel barrier (1410) of an antiferroelectric material. A valence band $E_V$ and a conduction band $E_B$ of the tunneling barrier (1410) including an antiferroelectric material and the Fermi levels $E_{FM1}$ and $E_{FM2}$ of the two electrodes (1405, 1430) of the on state are plotted.
FIG. 14b is a schematic band diagram generally illustrating, in accordance with the present disclosure, an off state of a tunnel junction consisting of two electrodes (1405, 1430) and the tunnel barrier (1410) including an antiferroelectric material. A valence band $E_V$ and a conduction band $E_B$ of the tunneling barrier (1410) including an antiferroelectric material and the Fermi levels $E_{FM1}$ and $E_{FM2}$ of the two electrodes (1405, 1430) of the off state are plotted.
Figure 14:
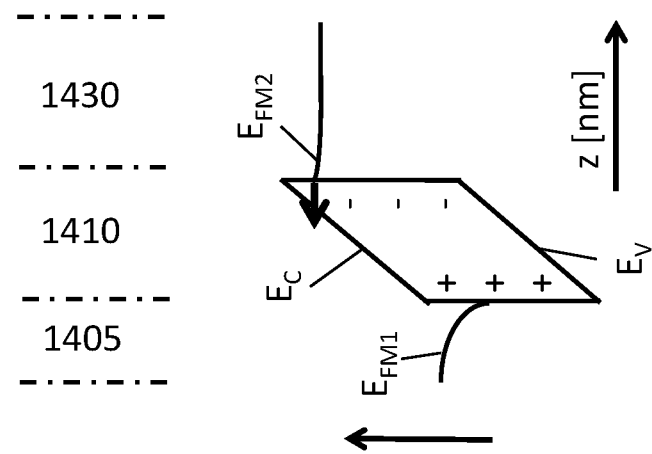

In one example, a first electrode of the tunnel junction is of Platinum (1430) and a second electrode is of TiN (1405), as plotted in FIG. 14a. According to such example, a barrier (1410) of the polarizable tunneling barrier is of 2 nm antiferroelectric Zirconiumdioxid ($ZrO_2$). The band diagram of the tunnel junction capacitor comprising the polarizable barrier is plotted in FIG. 14a. In the on state, electrons can tunnel from the Platinum (1430) to the second electrode (1405). The valence band $E_V$ and the conduction band $E_B$ of the tunneling barrier (1410) consisting of an antiferroelectric material and the Fermi levels $E_{FM1}$ and $E_{FM2}$ of the two electrodes (1405, 1430) are plotted. The band diagram of the off state is plotted in FIG. 13b. Tunneling is not possible because the effective tunneling barrier thickness is too high.

In accordance with the present disclosure, the polarizable tunnel junction capacitor includes an interfacial layer between the polarizable material and one electrode of the tunnel junction. The interfacial layer is a barrier layer. In one example, the interface layer is a low-k, high band gap material. The low k material causes a high field drop over interface layer. The interface layer might further prevent spontaneous back switching of the polarizable material by modulation of the energy potential to improve retention of the device.

In accordance with the present disclosure, the polarizable material may include thin interlayers to improve a grain size of the polarizable material.

Figure 15:
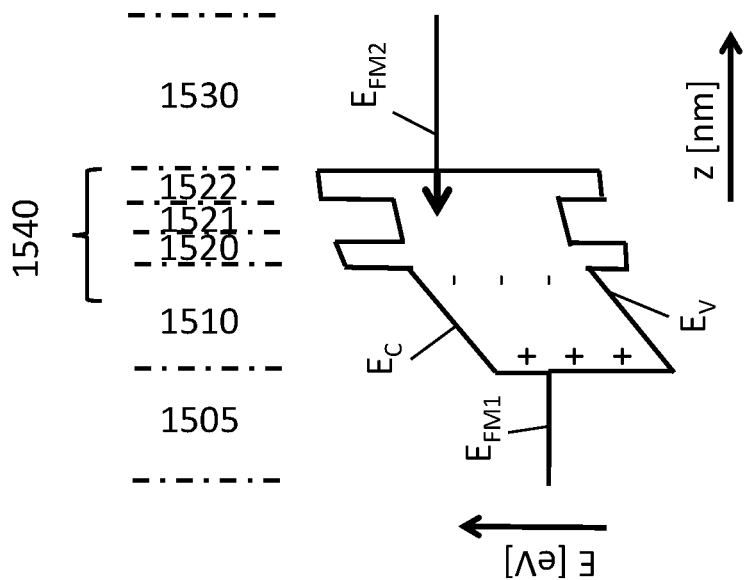
FIG. 15a is a schematic band diagram generally illustrating, in accordance with the present disclosure, an on state of a tunnel junction consisting of two electrodes (1505, 1530) and a resonant tunneling barrier (1540) including polarizable material (1510), two barriers (1520, 1522) and a dielectric material (1521) or conductor (not shown) in between. A valence band $E_V$ and a conduction band $E_B$ of the tunneling barrier (1540) including polarizable material (1510), two barriers (1520, 1522) and a dielectric material (1521) and the Fermi levels $E_{FM1}$ and $E_{FM2}$ of the two electrodes (1505, 1530) of the on state are plotted.
FIG. 15b is a schematic band diagram generally illustrating, in accordance with the present disclosure, an on state of a tunnel junction consisting of two electrodes (1505, 1530) and a resonant tunneling barrier (1540) including polarizable material (1510), two barriers (1520, 1522) and a dielectric material (1521) or conductor (not shown) in between. A valence band $E_V$ and a conduction band $E_B$ of the tunneling barrier (1540) including polarizable material (1510), two barriers (1520, 1522) and a dielectric material (1521) and the Fermi levels $E_{FM1}$ and $E_{FM2}$ of the two electrodes (1505, 1530) of the off state are plotted.
Figure 15:
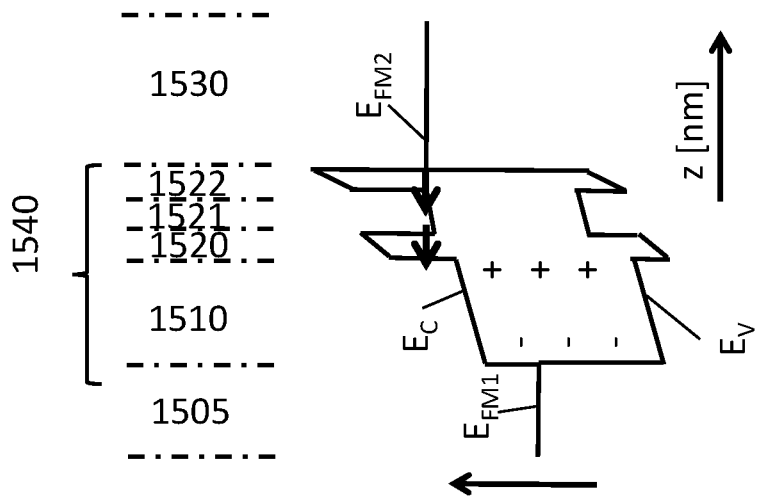

In another example, the polarizable tunnel junction capacitor includes a resonant tunneling barrier between the polarizable material and one electrode, such as illustrated by FIG. 15 and FIG. 15b. The resonant tunneling barrier may be thicker as compared to the polarizable layer. In one example, the resonant tunneling barrier has a smaller thickness as compared to the polarizable layer. In one example, it is advantageous to have the tunneling barrier made of a multitude of individual layers. In one example, the layers have a lower k-value $kb_a$ than the ferroelectric $k_f$ (i.e. $SiO_2$ for a SiHfO-ferroelectric). The polarization induced electrical field in the barrier layer is then about $k_f/k_{ba}$ times larger as compared to the field in the ferroelectric. Since the tunneling probability in the resonant tunneling diode depends not only on the electrical field but also on the density of states on both sides, the resonant tunneling barrier can be manufactured in a way that the current density first increases with increasing field for improved reading, but then decreases again when further increasing of the applied field for writing.

In one example, one electrode of the tunnel junction is made of TiN or Platinum (1530), and the second electrode is of TiN (1505), as plotted in FIG. 15a. In such example, the tunneling barrier consists of a polarizable layer and a resonant tunneling barrier. The two barriers (1520, 1522) of the resonate tunneling barrier are of 0.7 nm Silicon dioxide and, in between the two barrier materials, a lower bandgap material, e.g. HfO, or a conducting material like Ti, TiN with the thickness of 1 to 10 Å is used. The polarizable material (1510) is of 7 nm thick ferroelectric HfO. The band diagram of the tunnel junction capacitor comprising the resonant tunneling barrier is plotted in FIG. 15 for the on-state. The valence band $E_V$ and the conduction band $E_B$ of the tunneling barrier (1540) consisting of polarizable material (1510), two barriers (1520, 1522) and a dielectric material (1521) and the Fermi levels $E_{FM1}$ and $E_{FM2}$ of the two electrodes (1505, 1530) of the on state are plotted. Instead of a dielectric material (1521), a conducting material may be used. In the on state, electrons can tunnel from the first electrode (1530) to the second electrode (1505). The tunnel probability and, therefore, the tunnel current, is higher and has an improved reliability compared to known tunnel junction capacitors (FIG. 13a and FIG. 13b) because the tunneling thickness for each barrier is smaller. The band diagram of the off state is plotted in FIG. 13b. It is noted that tunneling is not possible because the effective barrier thickness is too high and no alignment of the conduction band of layer (1521) and first electrode (1530) is present.

In one example, the electrodes of the polarizable capacitor and the polarizable tunnel junction capacitor may comprise any one or more suitable conductive metals including, without limitation, TiN, TaN, TaCN, WCN, Ru, Re, RuO, Pt, Ir, IrO, Ti, TiAlN, TaA1N, W, WN, C, Si, Ge, SiGe and NbCN. The electrodes may be a combination with one or more conducting layers.

The terms "ferroelectric material" and "antiferroelectric material", as used herein, refers to a material that is at least partially in a ferroelectric state or antiferroelectric state and comprises, as main components, oxygen and any of the group consisting of Hf, Zr and (Hf, Zr). In one example, the ferroelectric material may comprise any of $HfO_2$, $ZrO_2$, any ratio of Hf and Zr combined with oxygen (e.g., ZrxHf1-xO2, where x<1), as well as any combinations thereof. In addition, the term "main components," as used herein, refers to any suitable number of O and any one or combinations of Hf, Zr and (Hf, Zr) per volumetric content, e.g., unit cell that is higher as compared to other components or further additives introduced in any suitable manner into a ferroelectric material oxide layer.

In one example, the antiferroelectric material can be of a field induced ferroelectric type of layer comprising $ZraXbO_2$, with X being an element of the periodic table with a smaller ionic radius than Zr and a>0, b>0. Suitable X elements can be one of Hf, Si, Al, Ge, elements of the second group of the periodic table and a>0, b>0. In addition to this combination, the antiferroelectric material layer may comprise HfaXbO2, with X being an element of the periodic table with a smaller ionic radius than Hf and a>0, b>0. Suitable elements for this combination can be one of the elements within the second group of periodic table (Zr, Si, Al, Ge) where a>0, b<0 as before.

In another example, the antiferroelectric material can be of a field induced ferroelectric type consisting of a pure $ZrO_2$ layer or comprising a ZrO2 or $HfO_2$ based dielectric material. In another example, the antiferroelectric material can be of a relaxor type ferroelectric material (e.g., $BaTiO_3$ or PbMg1/3Nb2/3O$_3$). In another example, the antiferroelectric material can be of an antiferroelectric type material like $PbZrO_3$.

In one example, the interface layer between one electrode and the polarizable material consists of $Al_2O_3$, $SiO_2$ or other dielectrics with low dielectric constant and high bandgap.

In one example, a thin interlayer or multiple thin interlayers may be used within the polarizable material to decrease the grain size to improve the reliability and decrease the current flow through of the polarizable tunnel junction. Using ferroelectric material or antiferroelectric material as described herein, comprising main components of oxygen and of any of the group consisting of Hf, Zr and (Hf, Zr), the thin interlayer can comprise $La_2O_5$, $Sc_2O_3$, SrO or other high band gap dielectric comparable to $ZrO_2$ band gap or doped $HfO_2$.

For example polarizable capacitors, the electrode layer may be deposited via any suitable process over a support structure. Some examples such formation processes which can be used to form conductive layers include atomic layer deposition (ALD), metal organic atomic layer deposition (MOALD), chemical vapor deposition (CVD), metal organic chemical vapor deposition (MOCVD), physical vapor deposition (PVD), or any other suitable deposition technique that facilitates formation of the conductive layers utilizing one or more suitable conductive materials as previously described herein. The conductive layer can be formed having a suitable thickness dimension, e.g., in the range from about 2 nm to about 5000 nm. In an example embodiment, a thickness range for the conductive layers can be within the range from about 2 nm to about 500 nm or in a range from about 2 nm to about 50 nm.

In the examples described herein, the polarizable materials can be formed utilizing any one of atomic layer deposition (ALD), metal organic atomic layer deposition (MOALD), chemical vapor deposition (CVD), metal organic chemical vapor deposition (MOCVD), physical vapor deposition (PVD), molecular beam epitaxy (MBE) deposition, Sol-gel or any other suitable deposition techniques that facilitate formation of the layer including the polarizable material as described herein (i.e., oxygen and at least one of Hf and Zr), where growth of each layer can be single-crystalline or poly-crystalline. Any suitable number and types of precursors may be utilized to introduce elements such as Hf and Zr into the layer utilizing any of the deposition techniques as described herein. The dielectric layer and the polarizable layer is formed to have a suitable thickness, e.g., in the range from about 2 nm to about 5000 nm. In one example, the thickness range for of both layers can be within the range from about 2 nm to about 500 nm or in a range from about 2 nm to about 50 nm.

Although specific embodiments have been illustrated and described herein, it will be appreciated by those of ordinary skill in the art that a variety of alternate and/or equivalent implementations may be substituted for the specific embodiments shown and described without departing from the scope of the present application. This application is intended to cover an adaptations or variations of the specific examples described herein. Therefore, it is intended that this invention be limited only by the claims and the equivalents thereof.

What is claimed is:
1. A memory cell comprising:
a node;
a layer stack including:
a first electrode;
a second electrode connected to the node;
a polarizable material layer disposed between the first and second electrodes and having at least two polarization states representing stored information;
a first transistor having a source, a drain, and a gate terminal, the gate terminal connected to the node; and a selector element having at least a first terminal and a second terminal, the second terminal connected to the node.

2. The memory cell of claim 1, the layer stack comprising a ferroelectric material.

3. The memory cell of claim 1, the first electrode of the layer stack connected to a plate line, and one of the source and drain of the first transistor is connected to a reference voltage.

4. The memory cell of claim 3, the reference voltage comprising ground.

5. The memory cell of claim 3, the selector element comprising a second transistor having a source, a drain, and a gate, where one of the source and drain of the second transistor represents the second terminal of the selector element and is connected to the node, and the gate is connected to a word line.

6. The memory cell of claim 5, the other of the source and drain of the first transistor connected to a select line, and the other of the source and drain of the second transistor represents the first terminal of the selector element and is connected to a bit line.

7. The memory cell of claim 5, the other of the source and drain of the first transistor connected to a bit line, and the other of the source and drain of the second transistor represents the first terminal of the selector element and is connected to the bit line.

8. The memory cell of claim 5, the other of the source and drain of the first transistor connected to a bit line, and the other of the source and drain of the second transistor represents the first terminal of the selector element and is connected to the plate line.

9. The memory cell of claim 7, the layer stack comprising a plurality of layer stacks, and the plate line comprising a plurality of plate lines, a first electrode of each layer stack connected to the node, and a second electrode of each layer stack connected to a different one of the plurality of plate lines.

10. The memory cell of claim 3, the other of the source and drain of the first transistor connected to a select line, the selector element comprising a two terminal element having a resistance, the first terminal of the selector element connected to a bit line.

11. The memory cell of claim 10, the selector element comprising a resistor.

12. The memory cell of claim 10, the selector element comprising a non-linear element having a non-linear resistance.

13. The memory cell of claim 12, the selector element including one of a diode, a threshold switch, and a field assisted switch.

14. The memory cell of claim 1, where:
the first electrode of the layer stack is connected to a reference voltage;
one of the source and drain of the first transistor is connected to a select line, and the other of the source and drain of the first transistor is connected to a bit line; and
the selector element comprises a second transistor having a source, a drain, and a gate, where one of the source and drain of the second transistor represents the second terminal of the selector element and is connected to the node, the other of the source and drain of the second transistor represents the first terminal of the selector element and is connected to the bit line, and the gate is connected to a word line.

15. The memory cell of claim 1, the layer stack comprising a ferroelectric capacitor.

16. The memory cell of claim 1, the layer stack comprising a ferroelectric tunnel junction.

17. A method of operating a memory cell having a layer stack including a first electrode; a second electrode connected to the node; a polarizable material layer disposed between the first and second electrodes and having at least two polarization states, a read transistor having a gate terminal connected to the node, and a selector element having at a first terminal and a second terminal with the second terminal connected to the node, the method comprising:
setting a polarization state of a polarizable material layer to a selected polarization state from at least two polarization states of the ferroelectric capacity by applying a voltage between the first electrode of the layer stack and the node such that a voltage across the polarizable material layer is greater than a coercive voltage of the polarizable material layer of the layer stack.

18. The method of claim 17, the method further comprising:
reading a polarization state of the polarizable material layer by applying a voltage pulse on the first electrode of the layer stack such that a voltage on the node resulting from a capacitive divider formed by the layer stack and a read transistor gate capacitance is representative of the polarization state.

19. The method of claim 18, the selector element comprising a select transistor having one of a drain terminal and a source terminal representing the second terminal, the other of the drain and source terminal representing the first terminal and being connected to the bit line, and a gate terminal connected to a word line, and where one of a drain terminal or a source terminal of the read transistor is connected to a reference voltage and the other of the drain and source terminal is connected to a select line, where applying the voltage between the plate line and bit line when setting a polarization state includes:
turning on the selector transistor such that the node is connected to the bit line by applying a voltage to the word line that is greater than a voltage on the bit line by a threshold value of the select transistor; and
applying a voltage to the plate line and a voltage to the bit line such that the voltage across the polarizable material layer of the layer stack is greater than a coercive voltage of the polarizable material layer.

20. The method of claim 19, where the polarization state of the polarizable material layer is set to a positive polarization state if an amplitude of the plate line voltage is less than the amplitude of the bit line voltage and the polarization state of the polarizable material layer is set to a negative polarization state if the amplitude of the plate line voltage is greater than the amplitude of the bit line voltage.

21. The method of claim 19, where applying the voltage pulse on the plate line when reading a polarization state includes:
applying a voltage on the word line to turn off the select transistor;
applying the voltage pulse on the plate line with an amplitude selected to create a potential difference across the polarizable material layer that exceeds the coercive voltage of the polarizable material layer; and
applying a voltage to the sense line to enable a current flow through the read transistor that depends on the potential of the node and is indicative of the polarization state of the polarizable material layer.

22. The method of claim 18, where applying the voltage pulse on the plate line when reading a polarization state includes:
- applying a voltage on the word line to turn off the select transistor;
- applying the voltage pulse on the plate line with an amplitude selected to create a potential difference across the polarizable material layer that does not exceed the coercive voltage of the polarizable material layer, inducing a polarization dependent current flow through the layer stack that is indicative of the polarization state of the polarizable material layer; and
- applying a voltage to the sense line to enable a current flow through the read transistor that depends on the potential of the node and is indicative of the polarization state of the polarizable material layer.

23. The method of claim 18, prior to turning off the select transistor, the method including pre-charging the node by:
- applying a voltage to the word line to turn on the select transistor; and
- applying a voltage to the bit line for a selected time period.

* * * * *